(12) United States Patent
Shin et al.

(10) Patent No.: US 12,343,971 B2
(45) Date of Patent: Jul. 1, 2025

(54) LAMINATING ROLLER, LAMINATING DEVICE AND METHOD FOR LAMINATING DISPLAY APPARATUS

(71) Applicant: SAMSUNG DISPLAY CO., LTD., Yongin-si (KR)

(72) Inventors: Jaiku Shin, Hwaseong-si (KR); Jiwon Han, Anyang-si (KR); Wonbaek Lee, Yongin-si (KR); Seung-ho Jung, Hwaseong-si (KR); Taehyeog Jung, Hwaseong-si (KR); Kyungmin Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 139 days.

(21) Appl. No.: 18/451,297

(22) Filed: Aug. 17, 2023

(65) Prior Publication Data
US 2023/0391062 A1 Dec. 7, 2023

Related U.S. Application Data

(62) Division of application No. 16/522,477, filed on Jul. 25, 2019, now abandoned.

(30) Foreign Application Priority Data

Sep. 28, 2018 (KR) .................. 10-2018-0116422

(51) Int. Cl.
B32B 37/00 (2006.01)
B32B 37/10 (2006.01)
H10K 71/00 (2023.01)

(52) U.S. Cl.
CPC .......... *B32B 37/10* (2013.01); *B32B 37/0053* (2013.01); *B32B 2457/206* (2013.01); *H10K 71/00* (2023.02)

(58) Field of Classification Search
CPC .. B32B 37/10; B32B 37/0053; B29C 66/8362
See application file for complete search history.

(56) References Cited

U.S. PATENT DOCUMENTS 5,356,507 A 10/1994 Wojtanowitsch et al.
10,392,534 B2 8/2019 Won et al.
(Continued)

FOREIGN PATENT DOCUMENTS

CN 108269498 A 7/2018
JP H 05-309746 11/1993
(Continued)

*Primary Examiner* — Philip C Tucker
*Assistant Examiner* — John Blades
(74) *Attorney, Agent, or Firm* — Womble Bond Dickinson (US) LLP

(57) ABSTRACT

A laminating roller, a laminating device, and a method for laminating a display apparatus are provided. A laminating device includes a stage on which a display module including a folding area foldable about a folding axis and at least one non-folding area, which is not folded, is configured to be seated; a pressing part over the stage to overlap the non-folding area and having a diameter; and a connection part over the stage to overlap the folding area and connected to the pressing part, and the connection part has a diameter less than that of the pressing part and extends in a direction perpendicular to the folding axis.

7 Claims, 20 Drawing Sheets

(56) References Cited

U.S. PATENT DOCUMENTS

| | | |
|---|---|---|
| 10,986,744 B2 | 4/2021 | Yeum et al. |
| 2004/0011459 A1 | 1/2004 | Henegar |
| 2004/0033093 A1 | 2/2004 | Wu et al. |
| 2006/0193609 A1 | 8/2006 | Rantzen |
| 2011/0025363 A1* | 2/2011 | Sumi ................ G02F 1/136259 |
| | | 324/760.01 |
| 2012/0222796 A1 | 9/2012 | Kamimura et al. |
| 2014/0154409 A1 | 6/2014 | Bregonzio |
| 2016/0009025 A1 | 1/2016 | Lee et al. |
| 2016/0062408 A1 | 3/2016 | Lee et al. |
| 2016/0257064 A1 | 9/2016 | Scaini et al. |

FOREIGN PATENT DOCUMENTS

| | | |
|---|---|---|
| KR | 10-2016-0013472 | 2/2016 |
| KR | 10-2016-0130924 | 11/2016 |
| KR | 10-2017-0038263 | 4/2017 |
| KR | 10-2018-0051695 | 5/2018 |

\* cited by examiner

ID APPARATUS

CROSS-REFERENCE TO RELATED APPLICATIONS

This patent application is a divisional of U.S. patent application Ser. No. 16/522,477, filed on Jul. 25, 2019, which claims priority to and the benefit of Korean Patent Application No. 10-2018-0116422, filed on Sep. 28, 2018 in the Korean Intellectual Property Office, the entire contents of both of which are hereby incorporated by reference.

BACKGROUND

1. Field

Aspects of embodiments of the present disclosure relate to a laminating roller, a laminating device, and a method for laminating a display apparatus.

2. Description of Related Art

A display apparatus displays various images on a display screen to provide information to a user. In recent years, a display apparatus including a flexible display member to be foldable and rollable is being developed. The flexible display apparatus may be foldable or rollable like a paper, unlike a flat panel display apparatus. The flexible display apparatus that is variously changeable in shape may be easily carried and may improve a user's convenience.

SUMMARY

According to aspect of embodiments of the present disclosure a display apparatus having improved durability and display quality and a method for laminating a display apparatus having improved durability and display quality are provided.

According to one or more embodiments of the inventive concept, a laminating device includes: a stage on which a display module including a folding area foldable about a folding axis and at least one non-folding area, which is not folded, is configured to be seated; a pressing part over the stage to overlap the non-folding area and having a diameter; and a connection part over the stage to overlap the folding area and connected to the pressing part, and the connection part has a diameter less than that of the pressing part and extends in a direction perpendicular to the folding axis.

In an embodiment, the pressing part may include: a first pressing part to overlap a first non-folding area of the non-folding area; and a second pressing part to overlap a second non-folding area of the non-folding area, wherein the connection part may connect the first pressing part to the second pressing part.

In an embodiment, the connection part may include: a first connection part connected to the first pressing part; a second connection part connected to the second pressing part; and a central part between the first connection part and the second connection part to connect the first connection part to the second connection part and having a diameter less than a mean diameter of each of the first connection part and the second connection part.

In an embodiment, each of the first connection part and the second connection part may have a diameter that gradually decreases in a direction that is adjacent to the central part.

In an embodiment, the central part may have a predetermined diameter.

In an embodiment, each of the first pressing part, the second pressing part, and the connection part may include: a core part extending in the direction perpendicular to the folding axis and having a first modulus; and a first cover part configured to surround an outer surface of the core part and having a second modulus less than the first modulus.

In an embodiment, the core part may include a metal.

In an embodiment, the first cover part may include urethane.

In an embodiment, at the connection part, at least a part of the core part may be exposed by the first cover part.

In an embodiment, each of the first pressing part, the second pressing part, and the connection part may further include a second cover part having a thickness and surrounding an outer surface of the first cover part.

In an embodiment, the second cover part may include rubber.

In an embodiment, each of the first pressing part, the second pressing part, and the connection part may include a core part extending in the direction perpendicular to the folding axis and having a first modulus, and each of the first pressing part and the second pressing part may further include a first cover part configured to surround an outer surface of the core part and having a second modulus less than the first modulus.

According to one or more embodiments of the inventive concept, a method for laminating a display apparatus includes: seating a plurality of plates on a seating area defined on a stage; seating a first adhesion member on the plates; seating a display module foldable about a folding axis on the first adhesion member; and pressing the display module to laminate the plates with the display module, wherein the seating area includes: first and second areas defined on the stage to be spaced apart from each other and overlap with non-folding areas of the display module; and a third area defined between the first and second areas on the stage to overlap with a folding area of the display module and including a spaced area, wherein, in the seating of the plurality of plates, the plates may be spaced apart from each other over the spaced area, and the folding axis may overlap the spaced area on a plane, and in the laminating of the plates with the display module, a pressing force applied to the third area may be less than that applied to each of the first and second areas.

In an embodiment, in the laminating of the plates with the display module, the display module may be pressed by using a laminating roller, which extends in a direction perpendicular to the folding axis on the plane and rotates to move in a direction parallel to the folding axis.

In an embodiment, the laminating roller may include: first and second pressing parts overlapping the first and second areas to press the non-folding areas of the display module; and a connection part connecting the first and second pressing parts to each other and overlapping at least the third area to press the folding area of the display module, wherein the connection part may have a diameter less than that of each of the pressing parts.

In an embodiment, the connection part may include: a first connection part connected to the first pressing part; a second connection part connected to the second pressing part; and a central part connecting the first connection part to the second connection part and pressing the folding area of the display module overlapping the spaced area, wherein the central part may have a diameter that is equal to or less than a mean diameter of each of the first connection part and the second connection part.

In an embodiment, the laminating roller may include: first and second pressing parts overlapping the first and second areas to press the non-folding areas of the display module; and a connection part connecting the first and second pressing parts to each other and overlapping at least the third area to press the folding area of the display module, wherein each of the first and second pressing parts may have a modulus greater than that of the connection part.

In an embodiment, at least a portion of the laminating roller may have an outer circumferential surface that has a modulus less than that of the central part.

In an embodiment, the display module may include a display panel including a plurality of display elements to display an image.

According to one or more embodiments of the inventive concept, a laminating roller includes: a connection part configured to press a folding area of a display module that is foldable about a folding axis; and first and second pressing parts configured to press non-folding areas of the display module supported by plates spaced apart from each other and are connected to each other by the connection part and each of which has a diameter greater than that of the connection part, wherein the connection part, the first pressing part, and the second pressing part may be integrated with each other and extend in a direction perpendicular to the folding axis.

BRIEF DESCRIPTION OF THE DRAWINGS

The accompanying drawings are included to provide a further understanding of the inventive concept, and are incorporated in and constitute a part of this specification. The drawings illustrate some exemplary embodiments of the inventive concept and, together with the description, serve to explain principles of the inventive concept. In the drawings.

DETAILED DESCRIPTION

Figure 1:
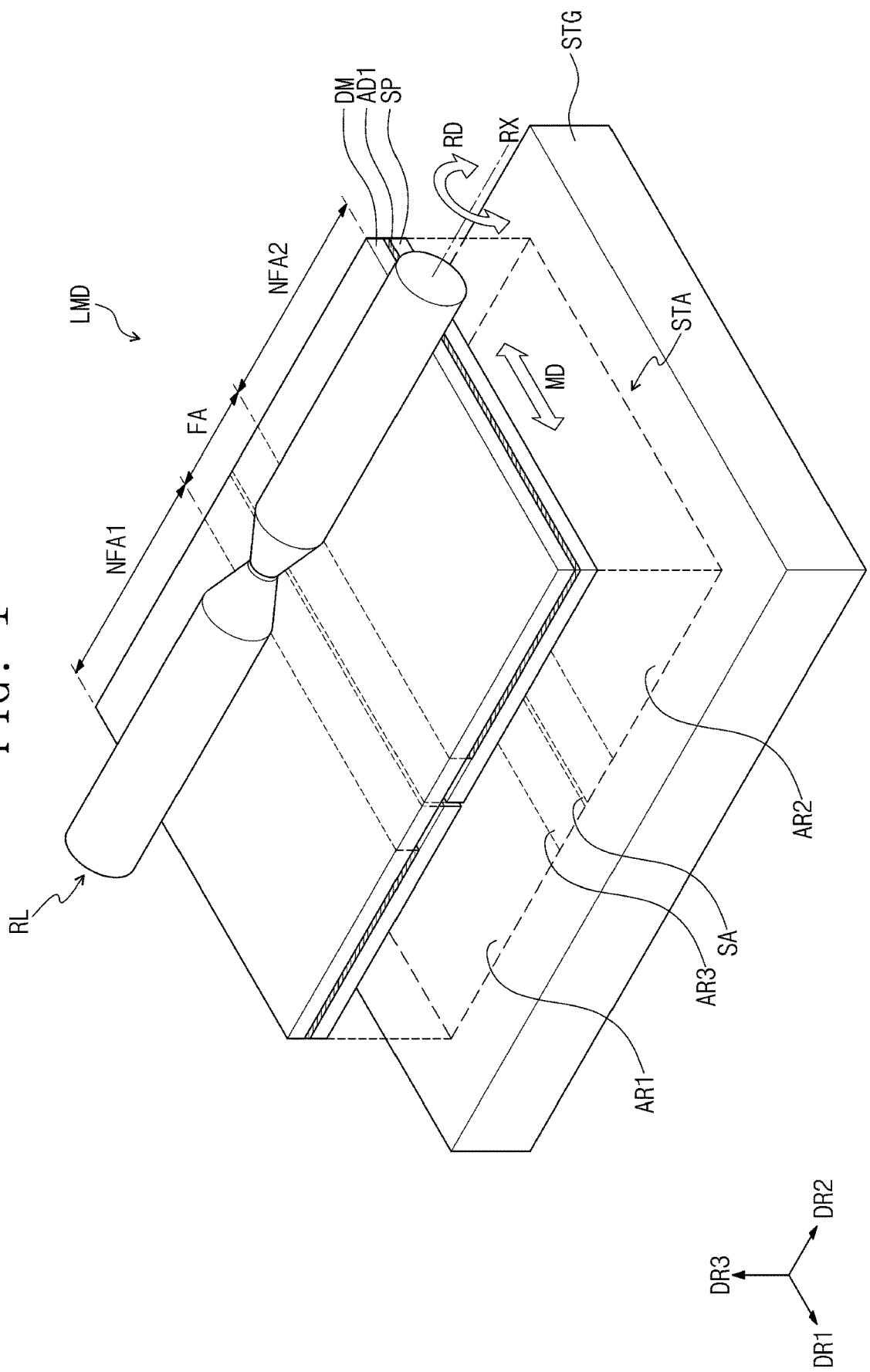
FIG. 1 is a view of a laminating device according to an embodiment of the inventive concept.

Aspects and features of the inventive concept, and implementation methods thereof will be clarified through some exemplary embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In this specification, it is also to be understood that when one component (or region, layer, portion) is referred to as being "on," "connected to," or "coupled to" another component, it may be directly disposed/connected/coupled on/to the one component, or one or more intervening third components may also be present.

Like reference numerals refer to like elements throughout. Also, in the figures, the thicknesses, ratios, and dimensions of components may be exaggerated for clarity of illustration.

The term "and/or" includes any and all combinations of one or more of the associated listed items.

It is to be understood that although terms such as "first" and "second" are used herein to describe various elements, these elements should not be limited by these terms. The terms are used to distinguish one component from other components. For example, a first element referred to as a "first" element in one embodiment can be referred to as a "second" element in another embodiment without departing from the scope of the appended claims. The terms of a singular form may include plural forms unless referred to the contrary.

Also, "under," "below," "above,' "upper," and the like may be used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component, or a combination thereof, but does not exclude other properties, fixed numbers, steps, operations, elements, components, or combinations thereof.

Herein, some exemplary embodiments of the inventive concept will be described with reference to the accompanying drawings.

FIG. 1 is a view of a laminating device according to an embodiment of the inventive concept.

Referring to FIG. 1, a laminating device LMD for a display apparatus according to an embodiment of the inventive concept includes a stage STG and a laminating roller RL.

Objects DM and SP to be laminated may be seated on the stage STG. The laminating device LMD according to an embodiment may be used for manufacturing a display apparatus DD (see FIG. 2) for displaying an image. That is, the objects DM and SP to be laminated according to an embodiment may be components of the display apparatus DD (see FIG. 2). The display apparatus DD (see FIG. 2) may include a display module DM, a support part SP, and a first adhesion member AD1. As a result, the laminating device LMD may be used for attaching the display module DM to the support part SP.

A seating area STA is defined on a top surface of the stage STG. The objects DM and SP to be laminated may be seated on the seating area STA. In an embodiment, the seating area STA includes a first area AR1, a second area AR2, and a third area AR3. The first area AR1 and the second area AR2 are spaced apart from each other. The third area AR3 is disposed between the first area AR1 and the second area AR2. The third area AR3 includes a spaced area SA defined at a center of the third area AR3. The spaced area SA extends in a first direction DR1. The first area AR1 and the second area AR2 face each other in a second direction DR2 perpendicular to the first direction DR1 on a plane.

In an embodiment, a normal direction on a top surface of the stage STG is indicated by a third direction DR3. A front surface (or a top surface) and a rear surface (or a bottom surface) of each of members is indicated by the third direction DR3. The front surface (or the top surface) and the rear surface (or the bottom surface) of each of the members may be distinguished by the third direction DR3. However, directions indicated by the first to third direction DR1, DR2, and DR3 may be a relative concept and thus changed into different directions.

The laminating roller RL is disposed on the stage STG. The laminating roller RL has a shape that extends in the second direction DR2. For convenience of description, in following description, the laminating roller RL may be referred to as a roller RL.

The roller RL is used for providing a pressing force to the display module DM. The pressing force is provided in a downward direction from the third direction DR3 toward the stage STG. The display module DM may be attached to the support part SP by the pressing force.

The roller RL may rotate in a direction (e.g., a predetermined direction) RD to linearly move on the stage STG. In an embodiment, a direction MD in which the roller RL moves is parallel to the first direction DR1.

Figure 2:
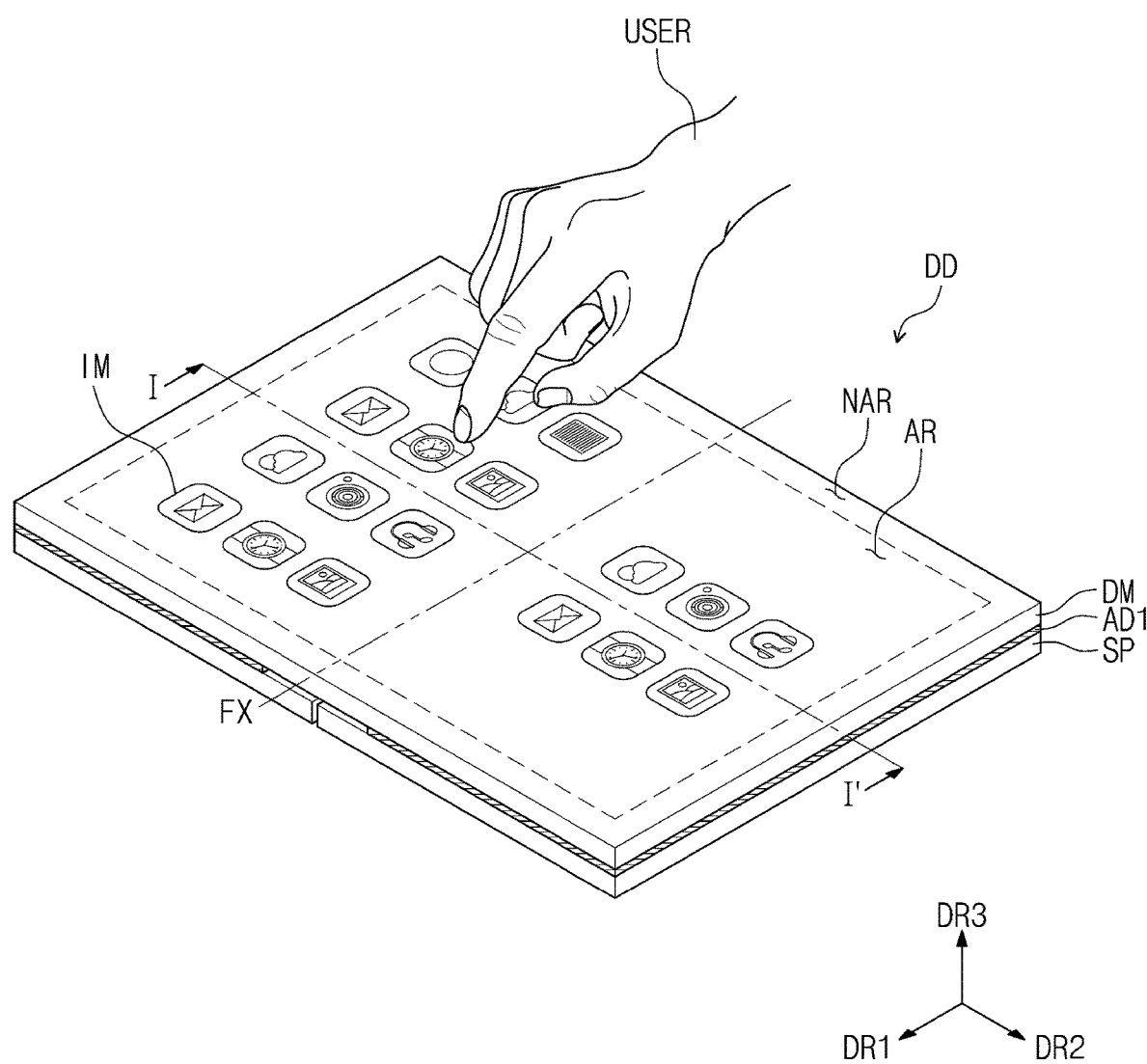
FIG. 2 is a perspective view of a display apparatus on which the lamination is completed.
Figure 3:
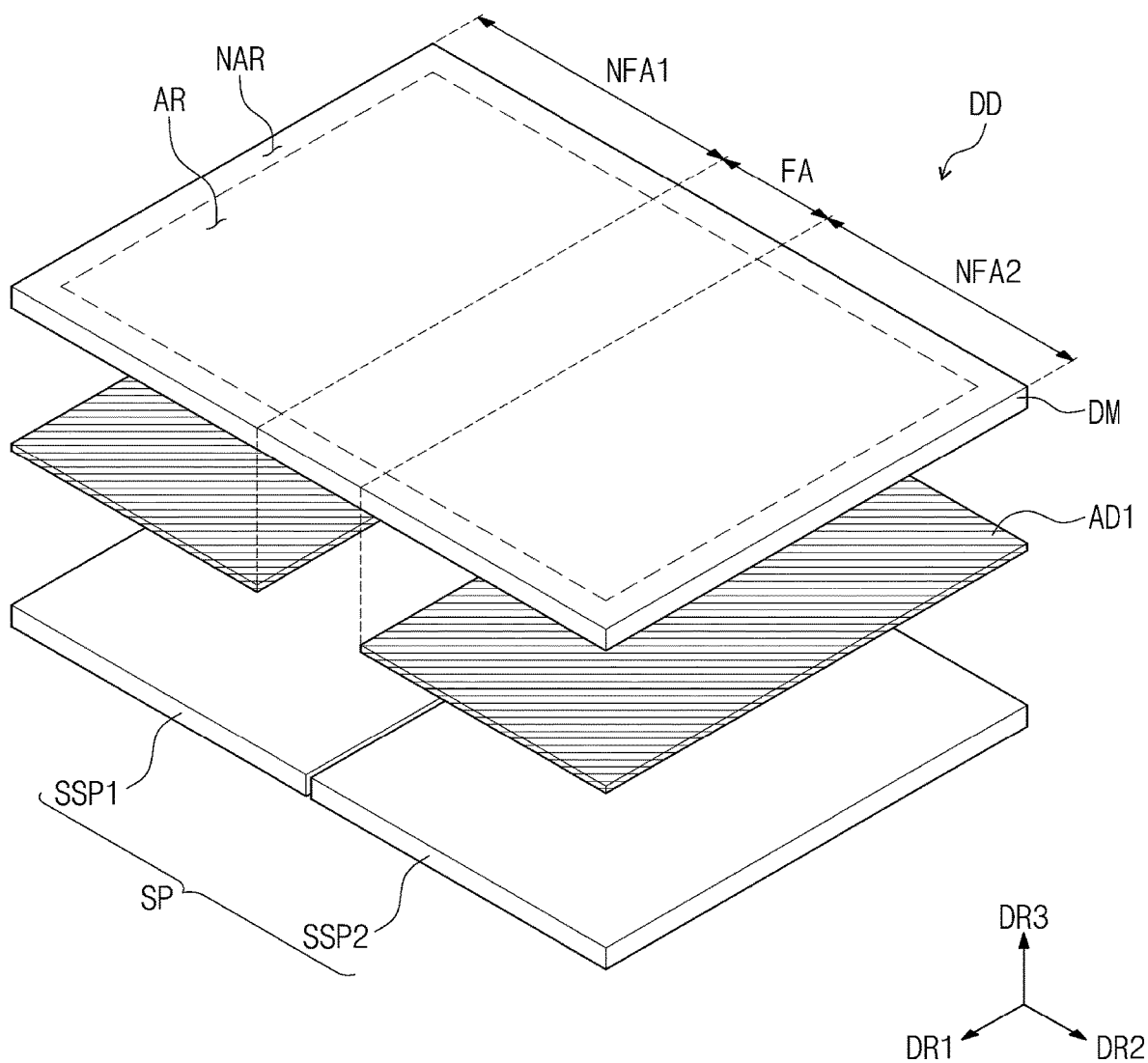
FIG. 3 is an exploded perspective view of the display apparatus of FIG. 2.
Figure 4:
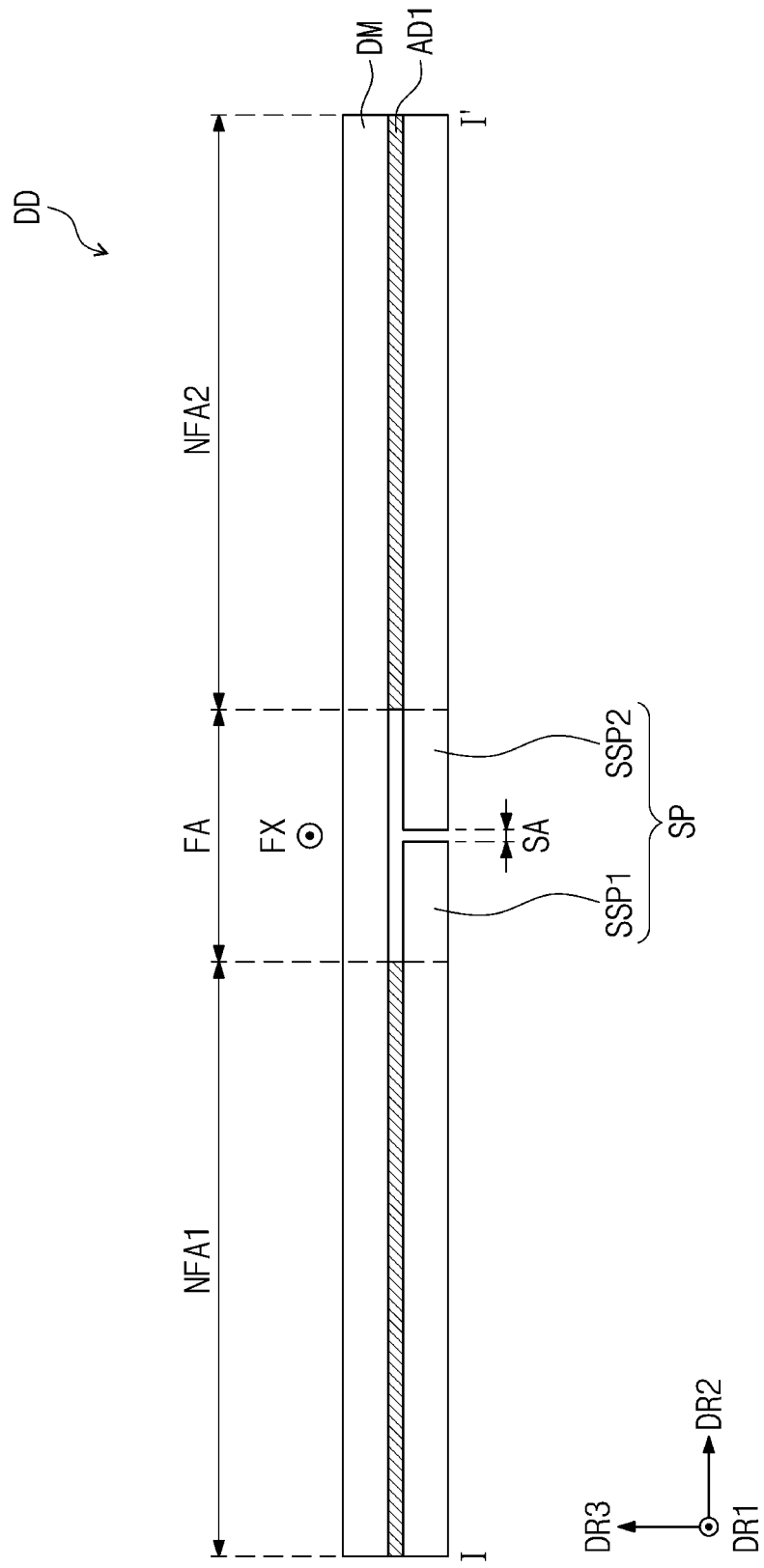
FIG. 4 is a cross-sectional view taken along the line I-I' of FIG. 2.

FIG. 2 is a perspective view of the display apparatus on which the lamination is completed; and FIG. 3 is an exploded perspective view of the display apparatus of FIG. 2. FIG. 4 is a cross-sectional view taken along the line I-I' of FIG. 2.

Referring to FIGS. 2 to 4, the display apparatus DD manufactured by using the laminating device according to an embodiment of the inventive concept has a rectangular shape with a short side in the first direction DR1 and a long side in the second direction DR2. However, the display apparatus DD according to embodiments of the inventive concept is not limited to the above-described shape and thus may have any of various shapes.

The display apparatus DD may be a flexible display apparatus DD. Particularly, the display apparatus DD according to an embodiment of the inventive concept may be folded or unfolded with respect to a folding axis FX extending in the first direction DR1. That is, the display apparatus may be a folding-type (foldable) display apparatus DD. The display apparatus DD may be divided into a plurality of areas according to a folded state.

In an embodiment, the display apparatus DD may be divided into a folding area FA and at least one non-folding area NFA1 and NFA2, which are arranged on the plane. The folding area FA may be an area to which folding stress due to the folding is applied. The folding area FA may overlap the folding axis FX on the plane.

According to an embodiment, the folding area FA of the display apparatus DD is defined between the two non-folding areas NFA1 and NFA2. Herein, the non-folding areas NFA1 and NFA2 may be referred to as a first non-folding area NFA1 and a second non-folding area NFA2. The first non-folding area NFA1 may be adjacent to one side of the folding area FA in the second direction DR2, and the second non-folding area NFA2 may be adjacent to the other side of the folding area FA in the second direction DR2.

The folding area FA, the first non-folding area NFA1, and the second non-folding area NFA2 may be defined on the planes of members constituting the display apparatus DD.

For example, the first non-folding area NFA1 of the display module DM, the first adhesion member AD1, and the support part SP may be seated on the first area AR1 of the stage STG, and the second non-folding area NFA2 may be seated on the second area AR2 of the stage STG. The folding area FA may be seated on the third area AR3 of the stage STG.

In an embodiment, one third area AR3 is defined on the stage STG, and one folding area FA is defined on the display apparatus DD, but embodiments of the inventive concept are not limited thereto. For example, according to another embodiment of the inventive concept, a plurality of third areas AR3 may be defined on the stage STG, and a plurality of folding areas FA may be defined on the display apparatus DD according to a number of folding axes FX.

In an embodiment, the display module DM overlaps the first to third areas AR1 to AR3 over the entire area. An area of the display module DM on the plane may correspond to the seating area STA.

The display module DM may be divided into an active area AR and a peripheral area NAR on the plane defined by the first direction DR1 and the second direction DR2. In an embodiment, the active area AR may be defined at a central portion of the display module DM on the plane. The peripheral area NAR is adjacent to the active area AR. In an embodiment, the peripheral area NAR may surround the active area AR. In an embodiment, the peripheral area NAR is defined in a frame shape surrounding the active area AR.

However, embodiments of the inventive concept are not limited to the shapes and number of the active area AR and the peripheral area NAR. For example, the display module DM according to another embodiment of the inventive concept may include only the active area AR. Here, the active area AR may be provided in plurality, and the plurality of active areas AR may be spaced apart from each other.

Figure 5:
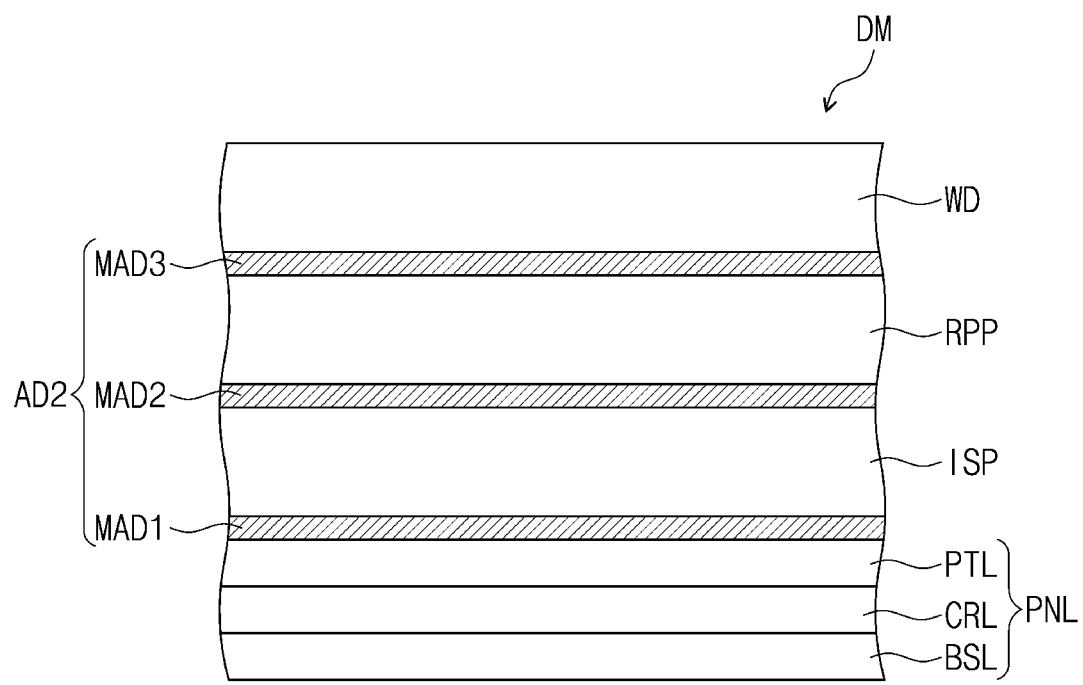
FIG. 5 is an enlarged cross-sectional view of a display module of the display apparatus of FIG. 2.

FIG. 5 is an enlarged cross-sectional view of the display module of FIG. 2.

Referring to FIG. 5 together with FIGS. 2 and 3, in an embodiment, the display module DM includes a display panel PNL, an input sensing layer ISP, an antireflection layer RPP, and a window WD.

The display panel PNL includes a base layer BSL, a display layer CRL, and an encapsulation layer PTL. The base layer BSL defines a rear surface of the display panel PNL. The base layer BSL may be a base layer for forming electrodes including the display panel PNL and display elements. For example, the base layer BSL may be provided in the form of a substrate.

The display layer CRL is disposed on the base layer BSL.

According to an embodiment of the inventive concept, a kind of the display panel PNL may be determined according to the configuration of the display layer CRL. The display panel PNL may be an organic light emitting display panel, a liquid crystal display panel, an electrophoretic display panel, or an electrowetting display panel, or may be one of various display panels capable of displaying images. In addition, the display panel PNL according to the inventive concept may include various embodiments, but is not limited to one embodiment. In the drawings that will be described below, a case in which the display panel PNL is the organic light emitting display panel will be described as an example.

The display layer CRL includes a plurality of display elements (not shown) and a plurality of transistors (not shown) for driving the display elements. Each of the display elements of the display panel PNL according to an embodiment may be an organic light emitting diode OLED (not shown).

The encapsulation layer PTL is disposed on the display layer CRL. The encapsulation layer PTL covers the display layer CRL to protect the display layer CRL from the outside. The encapsulation layer PTL may include an inorganic material.

The input sensing layer ISP is disposed on the display panel PNL. The input sensing layer ISP senses an external input provided to the display apparatus DD. For example, the input sensing layer ISP may sense an external input inputted through the human body USER (see FIG. 2) of a user. According to the inventive concept, the external input is not limited to a specific method. According to another embodiment of the inventive concept, the external input may be inputted in a manner such as an optical, touch, or magnetic manner. Although not shown, the input sensing layer ISP may include a plurality of input sensing electrodes (not shown) sensing the external input.

The input sensing layer ISP may sense the external input in any of various manners. For example, the input sensing layer ISP may be driven in a capacitance, resistive, or coordinate recognition manner.

The antireflection layer RPP is disposed on the input sensing layer ISP. The antireflection layer RPP overlaps the active area AR on the plane. The antireflection layer RPP may prevent or substantially prevent external light incident into the display device DD from the outside from being reflected by the display panel PNL and visible to the user. In an embodiment, although not shown, the antireflection layer RPP may include a polarizing layer (not shown) and a phase retardation layer (not shown).

The polarizing layer has a transmission axis and an absorption axis perpendicular to the transmission axis. One component of components of external light incident into the polarizing layer may be absorbed into or reflected by the absorption axis such that the light does not pass the polarizing layer. A component perpendicular to the one component of the components of the external light incident into the polarizing layer may pass through the polarizing layer. That is, the polarizing layer may linearly polarize the external light.

In an embodiment, the polarizing layer may be made of a polymer resin elongated in a specific direction. However, embodiments of the inventive concept are not limited to a kind of polarizing layer. For example, in another embodiment of the inventive concept, the polarizing layer may be a wire grid polarizer.

The phase retardation layer is disposed below the polarizing layer. The phase retardation layer has optical anisotropy. Thus, the phase retardation layer may retard a phase of one component of the incident light. That is, the phase retardation layer may convert a polarized state of the light. For example, the phase retardation layer may retard a phase of one component of the incident light by a wavelength of about $\lambda/4$. That is, the phase retardation layer may be a quadrature wavelength film. Thus, the phase of the one component of the light passing through the phase retardation layer may be retarded to convert the linearly polarized state into a circularly polarized state or convert the circularly polarized state into the linearly polarized state.

Thus, even though the external light incident into the display apparatus DD from the outside is reflected by the display module DM, the polarized state may be converted by the phase retardation layer to absorb or reflect the light by the polarizing layer. That is, the external light reflected by the display panel PNL may be invisible from the outside.

The window WD is disposed on the antireflection layer RPP. In an embodiment, the window WD provides an entire surface of the display apparatus DD to protect the antireflection layer RPP, the input sensing layer ISP, and the display panel PNL.

The display module DM may further include a second adhesion member AD2. In an embodiment, the second adhesion member AD2 is provided as a plurality of module adhesion members MAD1 to MAD3. Each of the module adhesion members MAD1 to MAD3 may be disposed between the above-described members to couple the members to each other. In an embodiment, the first module adhesion member MAD1 is disposed between the display panel PNL and the input sensing layer ISP. The second module adhesion member MAD2 is disposed between the input sensing layer ISP and the antireflection layer RPP. The third module adhesion member MAD3 is disposed between the antireflection layer RPP and the window WD.

Although not shown, the display module DM may further include a cushion member (not shown). The cushion member (not shown) may be disposed below the display panel PNL to support the display panel PNL.

According to another embodiment of the inventive concept, at least one of the input sensing layer ISP, the antireflection layer RPP, or the window WD may be omitted.

Referring again to FIGS. 1 to 4, the support part SP is disposed below the display module DM to support the display module DM. The support part SP may have a plate shape. The support part SP may have rigidity greater than that of the display module DM. For example, the support part SP may include a metal material. However, the embodiment of the inventive concept is not specifically limited to the material of the support part SP.

In an embodiment, the support part SP includes a plurality of plates including a first plate SSP1 and a second plate SSP2. The first plate SSP1 is disposed at one side in the second direction DR2. The first plate SSP1 overlaps a portion of the folding area FA and the first non-folding area NFA1. That is, the first plate SSP1 is seated on a portion of the third area AR3 and the first area AR1.

The second plate SSP2 is disposed at the other side in the second direction DR2. The second plate SSP2 overlaps the other portion of the folding area FA and the second non-folding area NFA2. That is, the second plate SSP2 is seated on the other portion of the third area AR3 and the second area AR2.

The first plate SSP1 and the second plate SSP2 are disposed to be spaced apart from each other in the second direction DR2. The spaced space overlaps the spaced area SA. That is, the first plate SSP1 and the second plate SSP2 are disposed on the seating area STA except for the spaced area SA and are respectively disposed on both sides with respect to the spaced area SA in the second direction DR2. The first plate SSP1 and the second plate SSP2 do not overlap the spaced area SA.

In an embodiment, the first adhesion member AD1 is provided in plurality. In FIGS. 1 to 4, two first adhesion members AD1 are provided as an example. The two first adhesion members AD1 are arranged in the second direction DR2. The first adhesion members AD1 are spaced apart from each other with the third area AR3 therebetween. In an embodiment, one first adhesion member AD1 of the two first adhesion members AD1 entirely overlaps the first area AR1, and the remaining first adhesion member AD1 entirely overlaps the second area AR2. Thus, the support part SP and the display module DM do not adhere to each other on the folding area FA overlapping the third area AR3.

Figure 6:
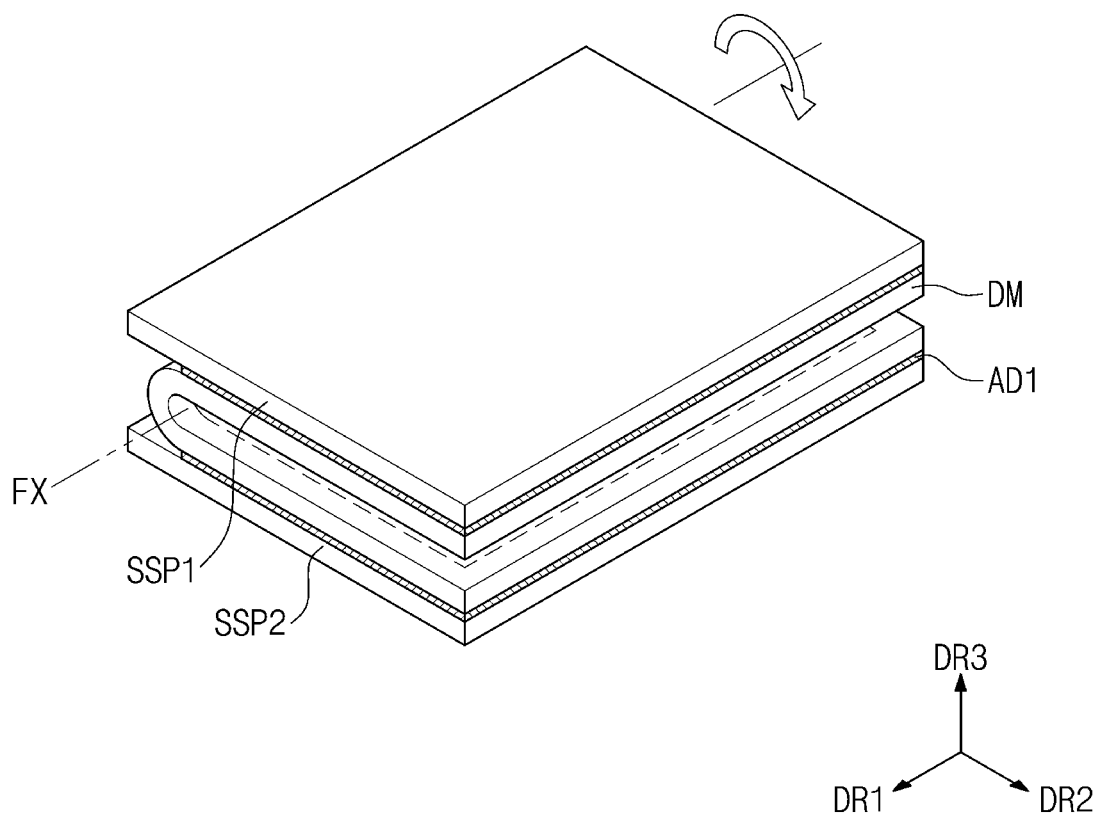
FIG. 6 is a perspective view illustrating a state in which the display apparatus of FIG. 2 is folded.
Figure 7:
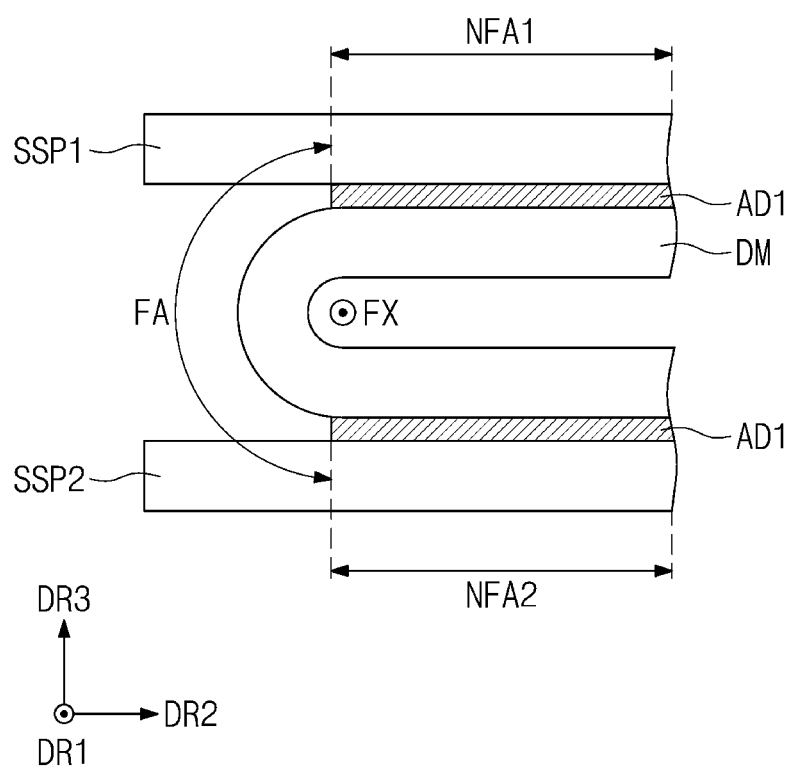
FIG. 7 is a cross-sectional view illustrating a state in which the display apparatus of FIG. 2 is folded.

FIG. 6 is a perspective view illustrating a state in which the display apparatus of FIG. 2 is folded; and FIG. 7 is a cross-sectional view illustrating a state in which the display apparatus of FIG. 2 is folded;

Referring to FIGS. 6 and 7, the display apparatus DD according to an embodiment of the inventive concept may be a foldable display apparatus. For example, the display apparatus DD may be an in-foldable display apparatus. That is, since the display apparatus DD may be in-folded with respect to the folding axis FX, folded top surfaces of the display module DM may face each other. In the in-folded state, the first and second plates SSP1 and SSP2 of the support part SP may face each other with the display module DM therebetween. In an embodiment, each of the first and second plates SSP1 and SSP2 are not changed in shape. In an embodiment, in the in-folded state, the first and second support plates SSP1 and SSP2 are disposed in parallel to each other with the display module DM therebetween.

Figure 8:
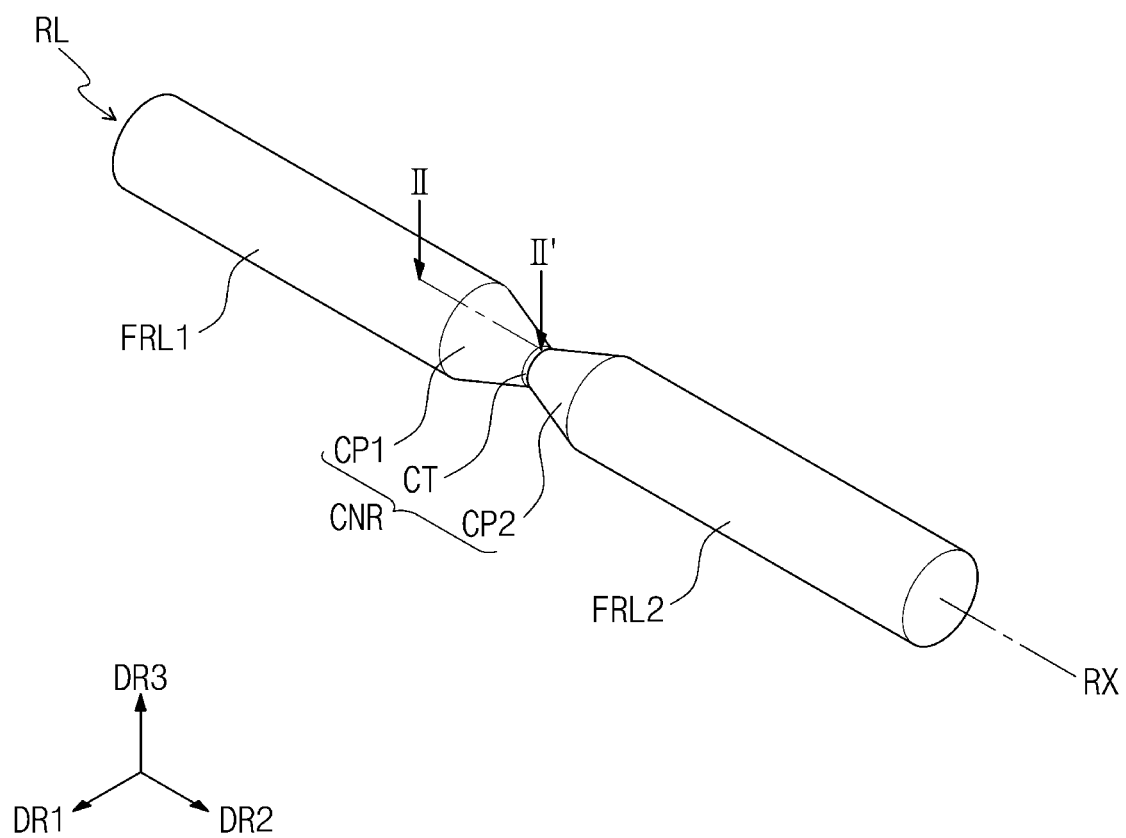
FIG. 8 is a perspective view of a laminating roller according to an embodiment of the inventive concept.
Figure 9:
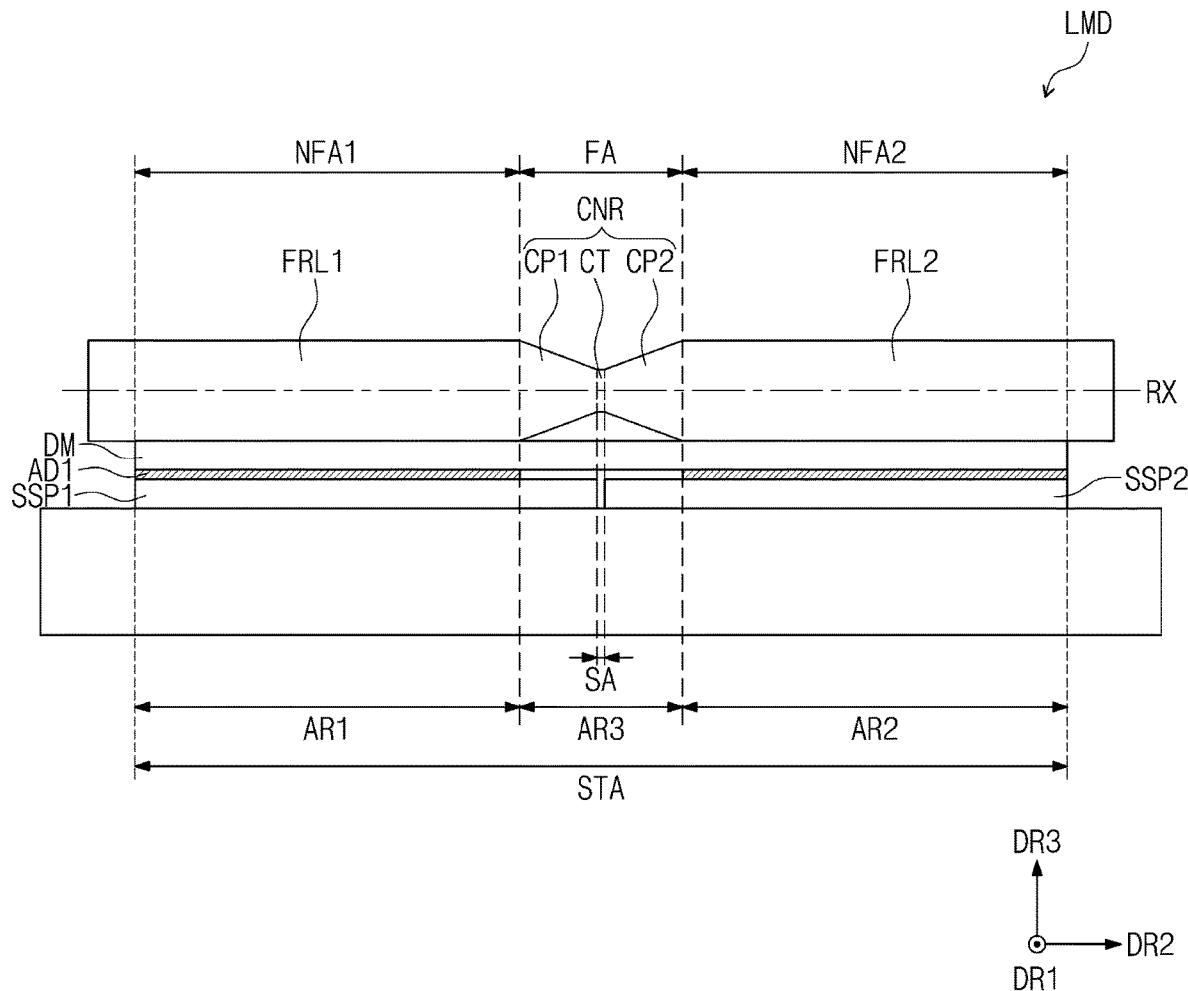
FIG. 9 is a cross-sectional view of the laminating device of FIG. 1.

FIG. 8 is a perspective view of a laminating roller according to an embodiment of the inventive concept; and FIG. 9 is a cross-sectional view of the laminating device of FIG. 1.

Referring to FIGS. 8 and 9, the roller RL according to an embodiment of the inventive concept extends in the second direction DR2. The roller RL may rotate with respect to a central axis RX parallel to the second direction DR2.

The roller RL includes at least one pressing part FRL1 and FRL2 and a connection part CNR. In the following description, an embodiment in which the roller RL includes two pressing parts FRL1 and FRL2 is described as an example.

The plurality of pressing parts FRL1 and FRL2 includes a first pressing part FRL1 and a second pressing part FRL2. The first pressing part FRL1 overlaps the first area AR1. The first pressing part FRL1 presses the first non-folding area NFA1 of the display module DM. The second pressing part FRL2 overlaps the second area AR2. The second pressing part FRL2 presses the second non-folding area NFA2 of the display module DM. The first pressing part FRL1 and the second pressing part FRL2 are arranged in the second direction DR2, and each of the first pressing part FRL1 and the second pressing part FRL2 has a cylindrical shape that extends in the second direction DR2. The first pressing part FRL1 and the second pressing part FRL2 are spaced apart from each other in the second direction DR2.

The connection part CNR is disposed between the first pressing part FRL1 and the second pressing part FRL2 in the second direction DR2. The connection part CNR connects the first pressing part FRL1 to the second pressing part FRL2. The connection part CNR overlaps the third area AR3, i.e., the folding area FA of the display module DM.

In an embodiment, the connection part CNR includes a first connection part CP1, a second connection part CP2, and a central part CT. The central part CT is disposed between the first connection part CP1 and the second connection part CP2. The central part CT overlaps the spaced area SA.

The first connection part CP1 is disposed between the central part CT and the first pressing part FRL1 to connect the central part CT to the first pressing part FRL1. The second connection part CP2 is disposed between the central part CT and the second pressing part FRL2 to connect the central part CT to the second pressing part FRL2.

The first pressing part FRL1, the second pressing part FRL2, and the connection part CNR are connected to each other to provide an integrated shape.

According to an embodiment of the inventive concept, each of the first pressing part FRL1 and the second pressing part FRL2 has a constant diameter. In an embodiment, the first pressing part FRL1 has a same diameter as that of the second pressing part FRL2. In an embodiment, each of the first pressing part FRL1 and the second pressing part FRL2 has a diameter greater than a mean diameter of the connection part CNR. Herein, a diameter of the roller RL will be described in further detail with reference to FIG. 11.

Figure 10:
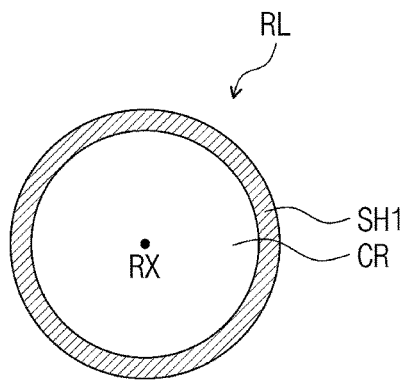
FIG. 10 is a transverse cross-sectional view of a laminating roller according to an embodiment of the inventive concept.
Figure 11:
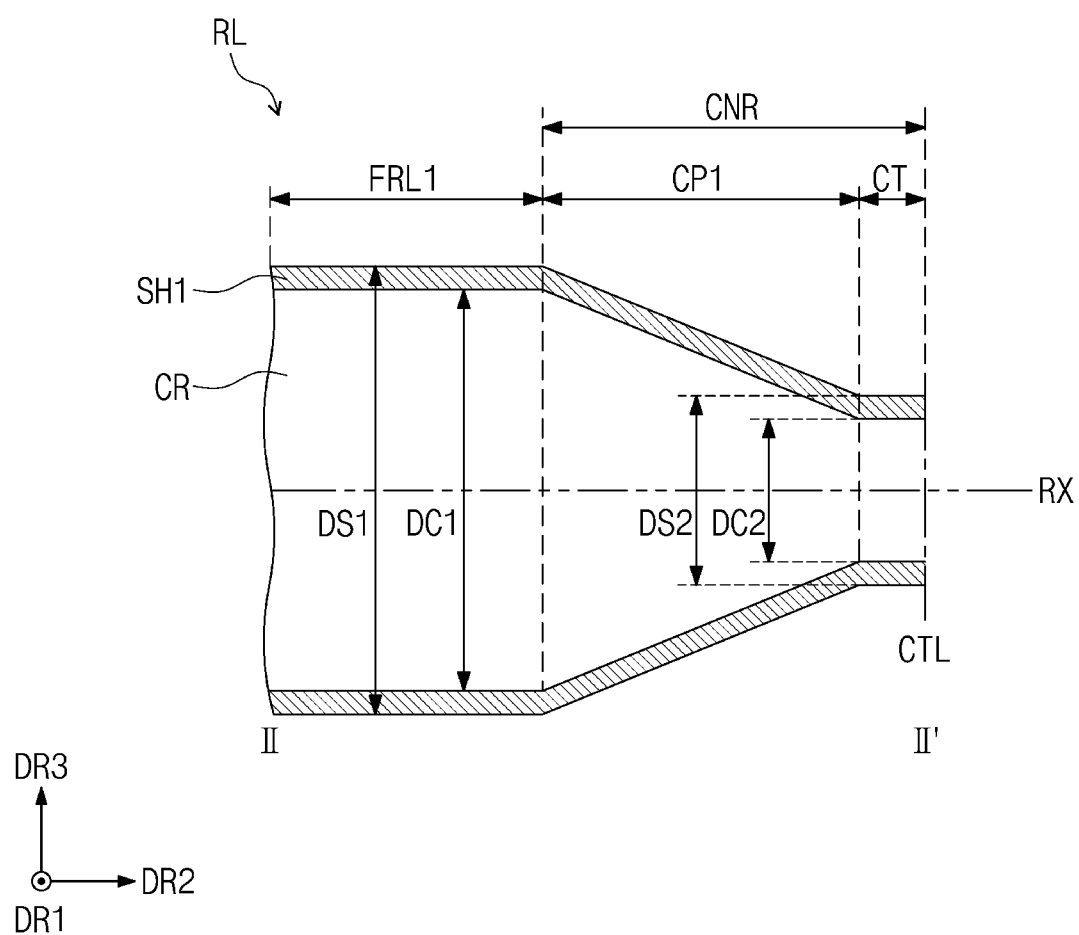
FIG. 11 is a cross-sectional view taken along the line II-II' of FIG. 8.

FIG. 10 is a transverse cross-sectional view of the laminating roller RL; and FIG. 11 is a cross-sectional view taken along the line II-II' of FIG. 8.

Although only the configurations of the first pressing part FRL1 and the first connection part CP1 are illustrated in FIG. 11, since the roller RL according to an embodiment of the inventive concept passes through a center of the roller RL in the second direction DR2 and is symmetrical with respect to a central line CTL extending in the third direction DR3, description with respect to a configuration of the second pressing part FRL2 and the second connection part CP2 will be omitted.

Referring to FIGS. 10 and 11, in an embodiment, each of the first pressing part FRL1, the second pressing part FRL2, and the connection part CNR includes a core part CR and a first cover part SH1 disposed in a direction that is away from the central axis RX of the roller RL.

The core part CR include the central axis RX. The core part CR extends in the second direction DR2. The core part CR has a first modulus. In an embodiment, for example, the first modulus may be equal to or greater than about 10 GPa. In an embodiment, the core part CR may include a metal material.

The first cover part SH1 surround an outer circumferential surface of the core part CR. The first cover part SH1 extends in the second direction DR2. In an embodiment, the first cover part SH1 has a uniform thickness. The first cover part SH1 has a second modulus. The second modulus has a value less than that of the first modulus. In an embodiment, for example, the second modulus may be in a range of about 1 GPa to about 10 GPa. In an embodiment, the first cover part SH1 may include urethane.

According to an embodiment of the inventive concept, the first pressing part FRL1 overlapping the first area AR1 has a first total diameter DS1. Here, the core part CR of the first pressing part FRL1 has a first core diameter DC1. The first total diameter DS1 and the first core diameter DC1 on the first area AR1 may have a predetermined value.

The first connection part CP1 has a funnel shape. That is, the first connection part CP1 may have a diameter that gradually decreases in a direction that is away from the first pressing part FRL1 and adjacent to the central part CT. That is, the first connection part CP1 may include an inclined surface in a cross-section of the roller RL.

In an embodiment, the inclined surface of the first connection part CP1 may have a linear shape, but is not limited thereto. In another embodiment of the inventive concept, the inclined surface may include a curved surface.

The central part CT has a second total diameter DS2. The second total diameter DS2 is less than the first total diameter DS1. Also, the first total diameter DS1 is less than a mean diameter of the first connection part CP1.

The core part CR of the central part CT has a second core diameter DC2. The second core diameter DC2 is less than the first core diameter DC1. Each of the second total diameter DS2 and the second core diameter DC2 may have a predetermined value on the spaced area SA (see FIG. 9). In an embodiment, a cross-section of the central part CT does not include an inclined surface.

Unlike embodiments of the inventive concept, when a roller pressing the display module DM has a cylindrical shape having a predetermined diameter on the entire area, the pressing force applied to the folding area FA of the display module DM may be the same as that applied to the non-folding area NFA of the display module DM. Here, a portion of the display module DM corresponding to the folding area FA may be recessed downward by the stepped portion between the plates SSP1 and SSP2 supporting the display module DM, on which the first adhesion member AD1 is not disposed, and the display module DM. That is, a portion of the display module DM overlapping the third area AR3 may be recessed downward. In this case, the display apparatus DD on which the lamination is completed may be deteriorated in display quality. However, according to an embodiment of the inventive concept, since each of the first and second pressing parts FRL1 and FRL2 of the roller RL has a diameter greater than that of the connection part CNR, the pressing force applied to the folding area FA of the display module DM may be less than that applied to each of the non-folding areas NFA1 and NFA2. That is, a phenomenon in which the display module DM is recessed downward may be moderated.

Also, unlike embodiments of the inventive concept, a portion of the display module DM corresponding to the spaced area SA between the plates SSP1 and SSP2 may be relatively recessed downward when compared to other portions of the display module on the areas except for the spaced area SA to deteriorate the display quality. However, according to an embodiment of the inventive concept, since the central part CT has a diameter equal to or less than that of each of the first connection part CP1 and the second connection part CP2, a phenomenon in which the display module DM is recessed on the spaced area SA may be moderated.

As a result, according to embodiments of the inventive concept, the display quality of the display apparatus DD may be improved.

FIGS. 12A to 12E are cross-sectional views, respectively, of rollers according to some other embodiments of the inventive concept.

For convenience of description, differences between these embodiments and the foregoing embodiment will be mainly described, and omitted descriptions will be derived from the foregoing embodiment. Also, the same reference symbols are given to the same components, and duplicated descriptions with respect to the components will be omitted.

Figure 12A:
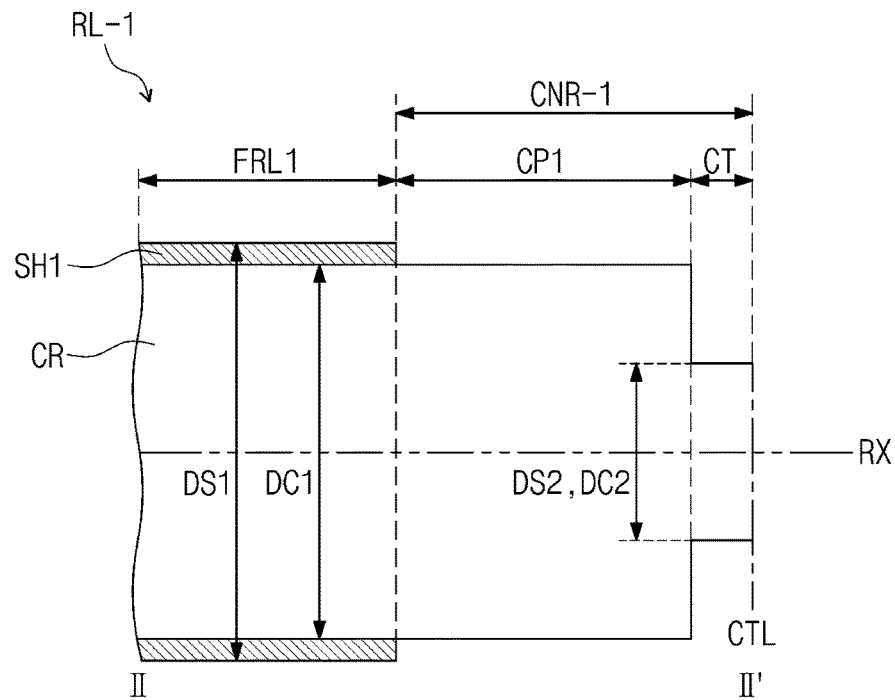
FIGS. 12A to 12E are cross-sectional views, respectively, of rollers according to some other embodiments of the inventive concept.

As illustrated in FIG. 12A, a first pressing part FRL1 of a roller RL-1 according to another embodiment of the inventive concept includes a core part CR and a first cover part SH1. The first pressing part FRL1 has a first total diameter DS1. Here, the core part CR of the first pressing part FRL1 has a first core diameter DC1.

In an embodiment, a connection part CNR-1 may include only the core part CR, but may not include the first cover part SH1. That is, in the roller RL-1, the core part CR may be exposed to the outside at a third area AR3 (see FIG. 9) overlapping the connection part CNR-1, i.e., the first cover part SH1 on the folding area FA.

In an embodiment, the first connection part CP1 has a predetermined diameter. In an embodiment, the first connection part CP1 may not include an inclined surface. In an embodiment, the core part CR of the first connection part CP1 has the first core diameter DC1.

The central part CT has a predetermined diameter. The central part CT has a second total diameter DS2. The second total diameter DS2 is less than the first total diameter DS1. Since the central part CT does not include the first cover part SH1, the central part CT may have a second total diameter DS2 that is the same as a second core diameter DC2 of the core part CR of the central part CT.

Figure 12B:
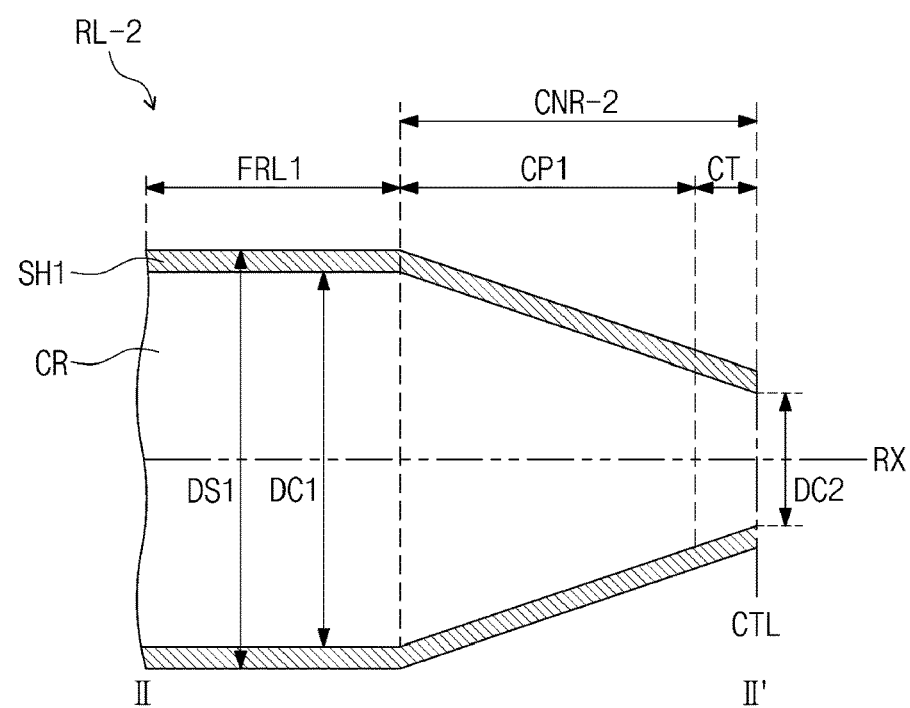

As illustrated in FIG. 12B, a cross-section of a connection part CNR-2 of a roller RL-2 according to another embodiment of the inventive concept may have a funnel shape. That is, each of a first connection part CP1 and a central part CT of the connection part CNR-2 may have a diameter that gradually decreases in a direction that is adjacent to a central line CTL.

Figure 12C:
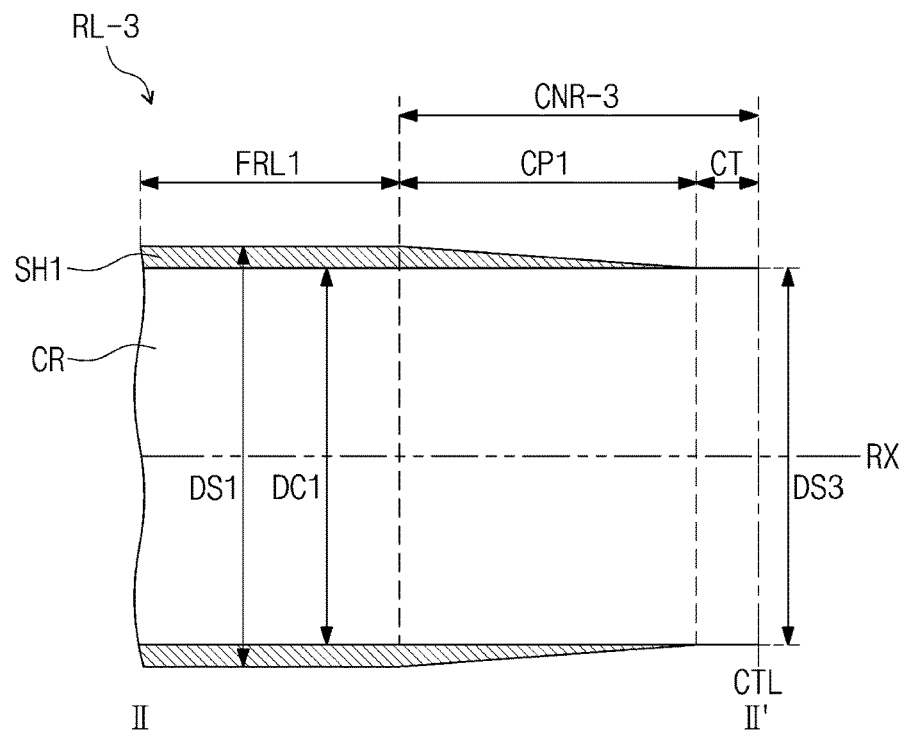

As illustrated in FIG. 12C, a first pressing part FRL1 and a connection part CNR-3 of a roller RL-3 according to another embodiment of the inventive concept include core parts CR having the same diameter, respectively. That is, the core part CR of the connection part CNR-3 has a first core diameter DC1.

The first pressing part FRL1 includes a core part CR and a first cover part SH1. The first pressing part FRL1 has a first total diameter DS1. Here, the core part CR of the first pressing part FRL1 has a first core diameter DC1.

According to an embodiment, the first cover part SH1 of the first connection part CP1 may have a thickness that gradually decreases in a direction that is adjacent to the central part CT.

In an embodiment, the central part CT includes only the core part CR. That is, the central part CT does not include the first cover part SH1. Thus, the central part CT has a third total diameter DS3. The third total diameter DS3 is the same as the first core diameter DC1.

Figure 12D:
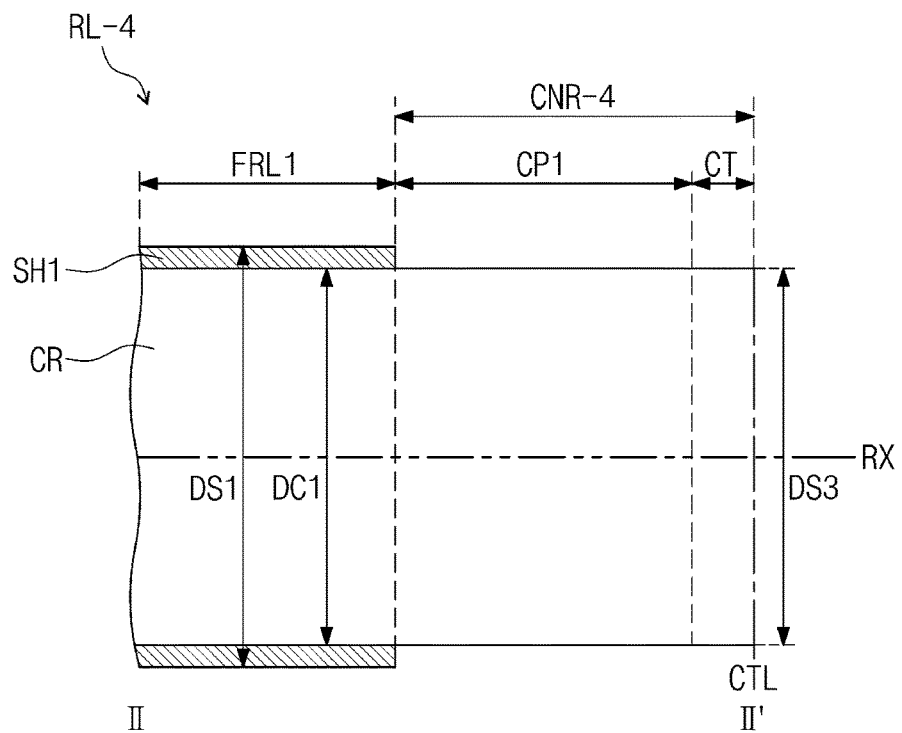

As illustrated in FIG. 12D, a first pressing part FRL1 and a connection part CNR-4 of a roller RL-4 according to another embodiment of the inventive concept include core parts CR having the same diameter, respectively. That is, the core part CR of the connection part CNR-4 has a first core diameter DC1.

According to an embodiment, each of the first connection part CP1 and the central part CT includes only the core part CR, but does not include the first cover part SH1. Thus, the connection part CNR-4 has a third total diameter DS3. Here, the third total diameter DS3 is the same as the first core diameter DC1.

Figure 12E:
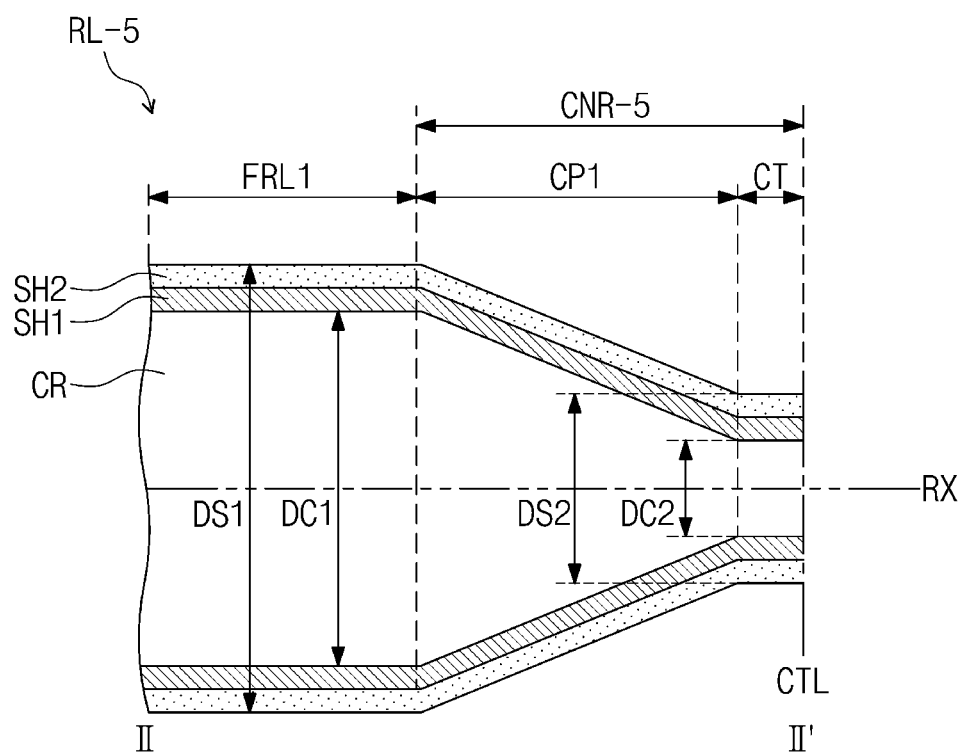

As illustrated in FIG. 12E, a roller RL-5 according to another embodiment of the inventive concept includes a connection part CNR-5 and further includes a second cover part SH2 surrounding an outer circumferential surface of the first cover part SH1.

In an embodiment, the second cover part SH2 has a uniform thickness. The second cover part SH2 has a third modulus. In an embodiment, the third modulus has a value less than the second modulus. In an embodiment, for example, the third modulus may be less than about 1 GPa. In an embodiment, the second cover part SH2 may include rubber.

Figure 13:
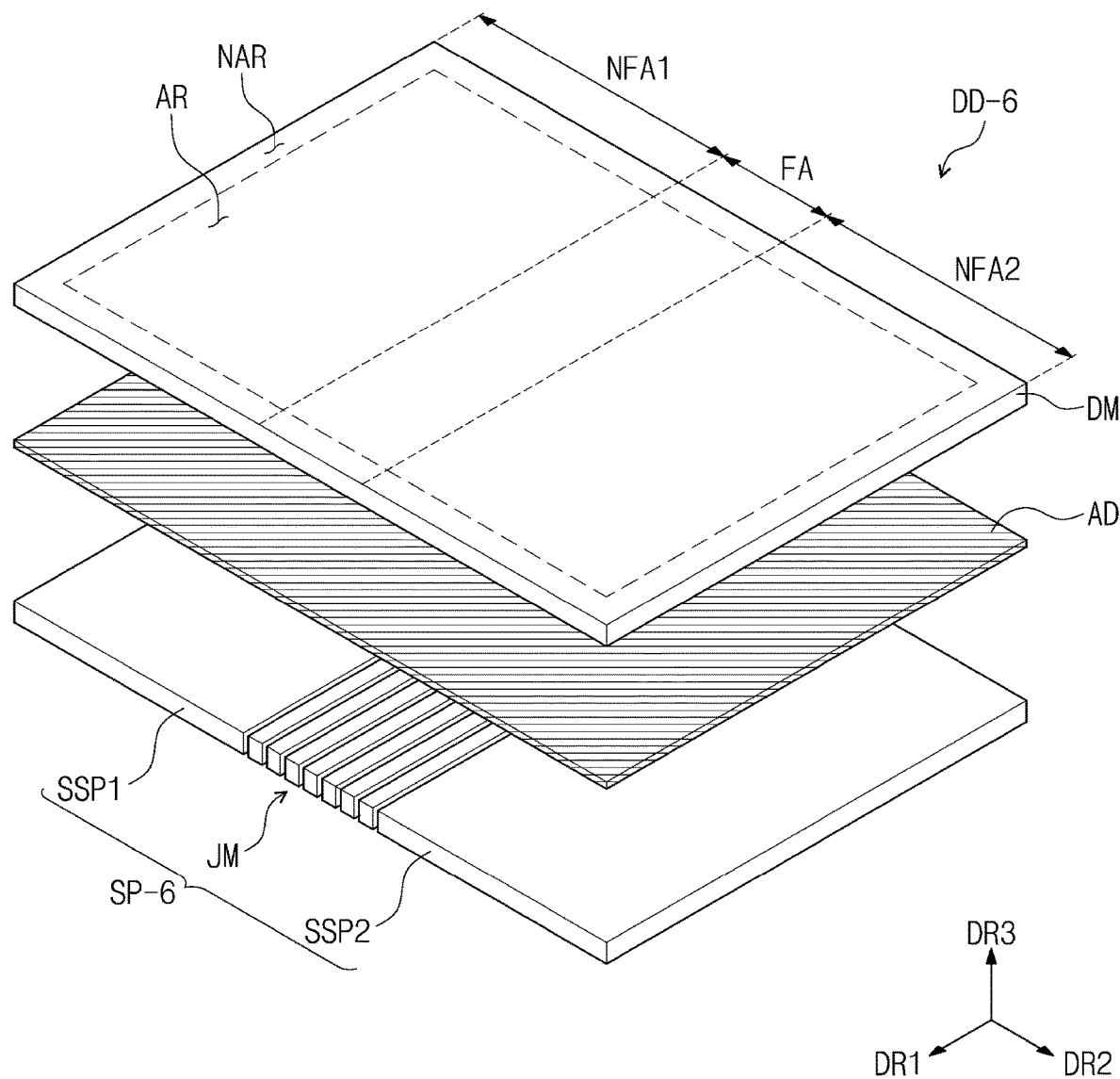
FIG. 13 is an exploded perspective view of a display apparatus according to another embodiment of the inventive concept.
Figure 14:
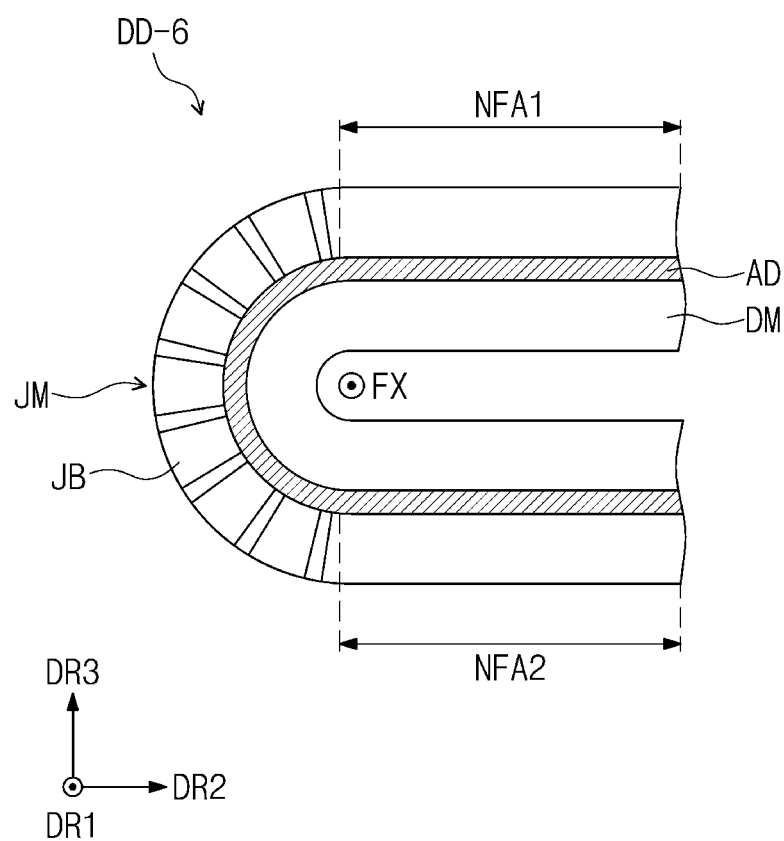
FIG. 14 is a cross-sectional view illustrating a state in which the display apparatus of FIG. 13 is folded.
Figure 15:
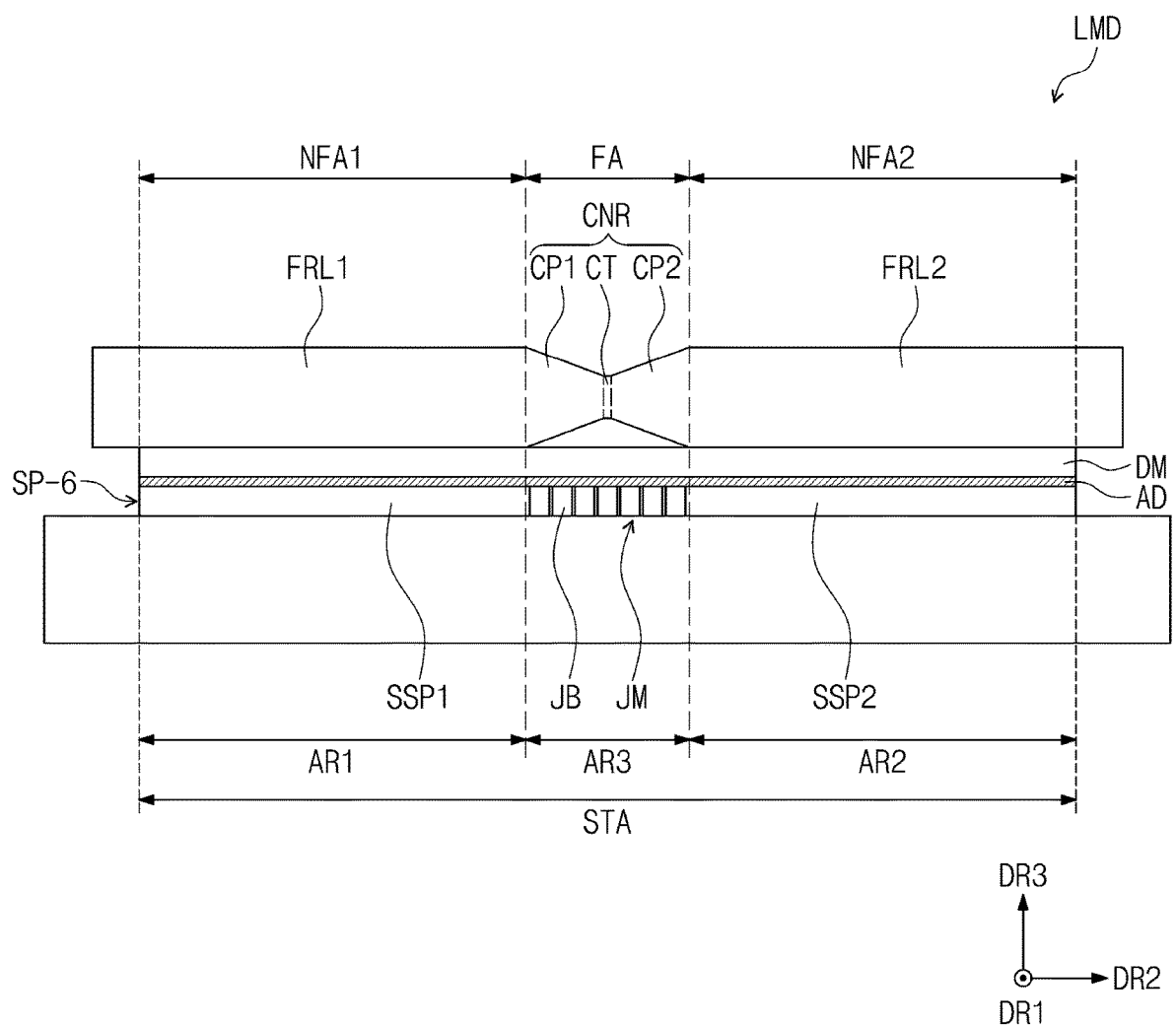
FIG. 15 is a cross-sectional view of a laminating device for the display apparatus of FIG. 13.

FIG. 13 is an exploded perspective view of a display apparatus according to another embodiment of the inventive concept; and FIG. 14 is a cross-sectional view illustrating a state in which the display apparatus of FIG. 13 is folded. FIG. 15 is a cross-sectional view of a laminating device for the display apparatus of FIG. 13.

For convenience of description, differences between this embodiment and the foregoing embodiment will be mainly described, and omitted descriptions will be derived from the foregoing embodiment. Also, the same reference symbols are given to the same components, and duplicated descriptions with respect to the components will be omitted.

Referring to FIGS. 13 to 15, a support part SP-6 of a display apparatus DD-6 according to another embodiment of the inventive concept may further include a joint member JM. The joint member JM is disposed between a first plate SSP1 and a second plate SSP2 in the second direction DR2. The joint member JM overlaps a folding area FA of a display module DM.

The joint member JM includes a plurality of joint bars JB. Each of the joint bars JB extends in the first direction DR1, and the joint bars JB are arranged in the second direction DR2. Although not shown, the joint bars JB may be connected to each other by a connection member (not shown). For example, the connection member may be a hinge. The connection member may be disposed between the plurality of joint bars JB. When the display apparatus DD-6 is folded, each of the joint bars JB may rotate by a distance (e.g., a predetermined distance) by using the connection member as a center.

A first adhesion member AD is disposed between the display module DM and a support part SP-6. In an embodiment, the first adhesion member AD has a shape that entirely overlaps a seating area STA. The first adhesion member AD may be provided in a single shape. That is, in an embodiment, the first adhesion member AD may overlap the folding area FA. Thus, a stepped portion may be provided between the above-described support part SP-6 and the display module DM.

According to an embodiment, when a laminating process of a display apparatus is performed, a spot may be generated on a display surface of the display module DM in the first direction DR1 by a space spaced between the plurality of joint bars JB. That is, the display apparatus may be deteriorated in display quality. However, according to an embodiment of the inventive concept, since pressing force applied to the folding area FA is less than that applied to non-folding areas NFA1 and NFA2, a deterioration in display quality of the display apparatus DD-6 may be reduced when the display apparatus DD-6 includes the joint member JM.

Figure 16:
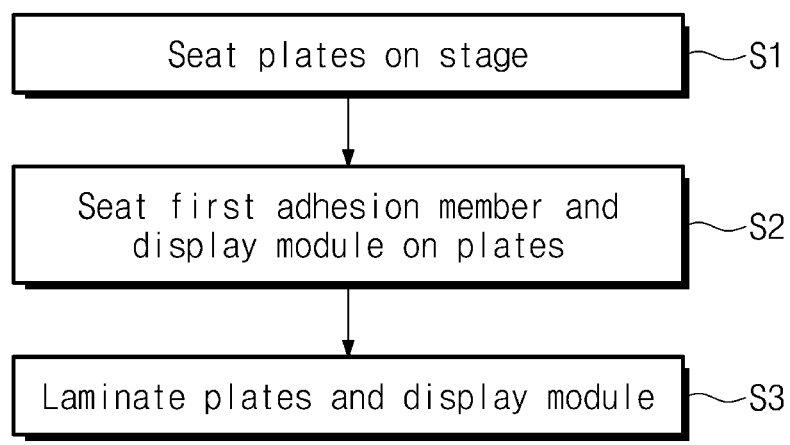
FIG. 16 is a flowchart illustrating a method for laminating the display apparatus according to an embodiment.

FIG. 16 is a flowchart illustrating a method for laminating the display apparatus according to an embodiment.

Referring to FIGS. 1, 9, and 16, a method for laminating a display apparatus DD includes a process (51) of seating first and second plates SSP1 and SSP2 on a seating area STA on a stage STG, a process (S2) of sequentially seating a first adhesion member AD1 and a display module DM on the first and second plates SSP1 and SSP2, and a process (S3) of laminating the first and second plates SSP1 and SSP2 and the display module DM.

According to an embodiment, in the process (S3) of the laminating the first and second plates SSP1 and SSP2 and the display module DM, a pressing force applied to a folding area FA of the display module DM overlapping a third area AR3 of the seating area STA is less than that applied to each of a first non-folding area NFA1 of the display module DM overlapping a first area AR1 and a second non-folding area NFA2 of the display module DM overlapping a first area AR2. For example, the pressing force may be differently applied for each area on the display module DM by using the above-described roller RL. The roller RL moves in the first direction DR1 parallel to a folding axis FX of the display apparatus DD and has a shape extending in the second direction DR2.

FIGS. 17A to 17E are cross-sectional views, respectively, of rollers according to some other embodiments of the inventive concept.

For convenience of description, differences between these embodiments and the foregoing embodiments will be mainly described, and omitted descriptions will be derived from the foregoing embodiments. Also, the same reference symbols are given to the same components, and duplicated descriptions with respect to the components will be omitted.

Referring to FIGS. 17A to 17E, rollers RL-7, RL-8, RL-9, RL-10, and RL-11 according to some other embodiment of the inventive concept may have a predetermined diameter. A first pressing part FRL1 and connection parts CNR-7, CNR-8, CNR-9, CNR-10, and CNR-11 of the rollers RL-7, RL-8, RL-9, RL-10, and RL-11 may have the same diameter.

Also, a modulus of each of the connection part CNR-7, CNR-8, CNR-9, CNR-10, and CNR-11 of the respective rollers RL-7, RL-8, RL-9, RL-10, and RL-11 may have a value less than that of the first pressing part FRL1. When the display module DM and the support part SP are combined with each other by using the rollers RL-7, RL-8, RL-9, RL-10, and RL-11, a pressing force applied to the folding area FA may be less than that applied to each of the first and second non-folding areas NFA1 and NFA2. That is, deterioration in display quality of the display apparatus DD on which the lamination process is completed may be reduced.

Figure 17A:
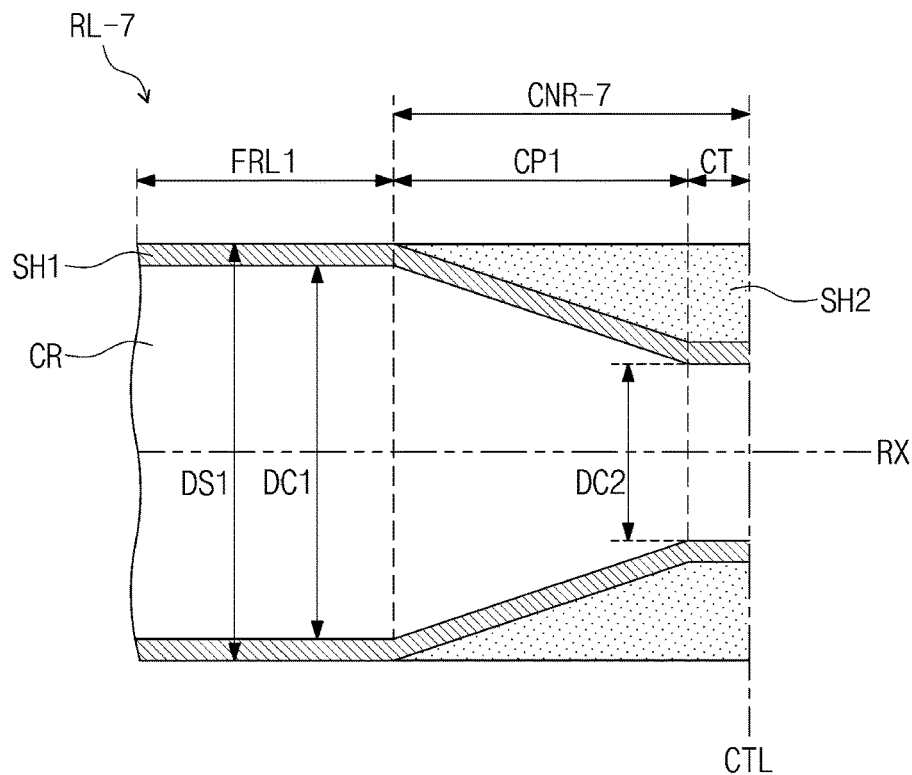
FIGS. 17A to 17E are cross-sectional views, respectively, of rollers according to some other embodiments of the inventive concept.

As illustrated in FIG. 17A, the connection part CNR-7 according to another embodiment of the inventive concept further includes a second cover part SH2. The second cover part SH2 surrounds an outer circumferential surface of the first cover part SH1. The second cover part SH2 has a third modulus. The third modulus has a value less than the second modulus.

According to an embodiment, the second cover part SH2 on the first connection part CP1 may have a thickness that gradually increases in a direction that is adjacent to the central part CT. An increase rate in thickness of the second cover part SH2 provided on the first connection part CP1 may be same as a decrease rate in thickness of a core part CR provided in the first connection part CP1.

Figure 17B:
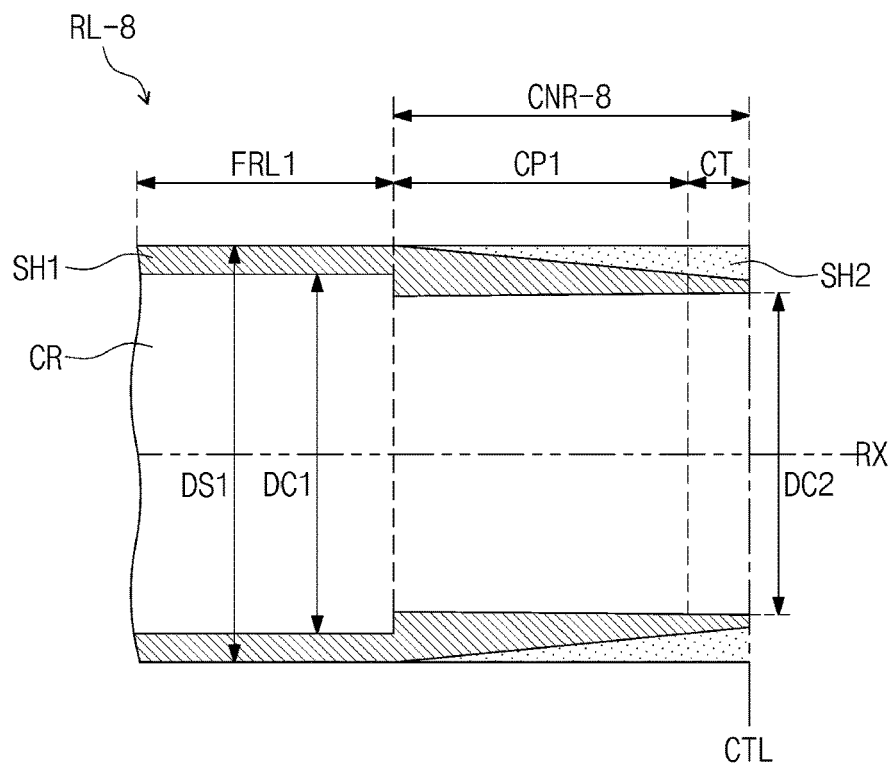

As illustrated in FIG. 17B, core parts CR of the first pressing part FRL1 and the connection part CNR-8 of the roller RL-8 according to another embodiment of the inventive concept may have diameters different from each other. The core part CR of the first pressing part FRL1 has a first core diameter DC1. The core part CR of the connection part CNR-8 has a second core diameter DC2. The second core diameter DC2 has a value less than that of the first core diameter DC1. In an embodiment, each of the first core diameter DC1 and the second core diameter DC2 has a predetermined value.

An outer surface of the first cover part SH1 of the connection part CNR-8 has a funnel shape in a cross-section. The outer surface of the first cover part SH1 of the connection part CNR-8 may be connected to an outer surface of the first cover part SH1 of the first pressing part FRL1 and have a thickness that gradually decreases in a direction that is adjacent to a central line CTL.

The connection part CNR-8 may further include a second cover part SH2. In an embodiment, the second cover part SH2 has a thickness that gradually increases in a direction that is adjacent to a central part CT. An increase rate in thickness of the second cover part SH2 provided on a first connection part CP1 may be the same as a decrease rate in thickness of a first cover part SH1 provided on the first connection part CP1.

Figure 17C:
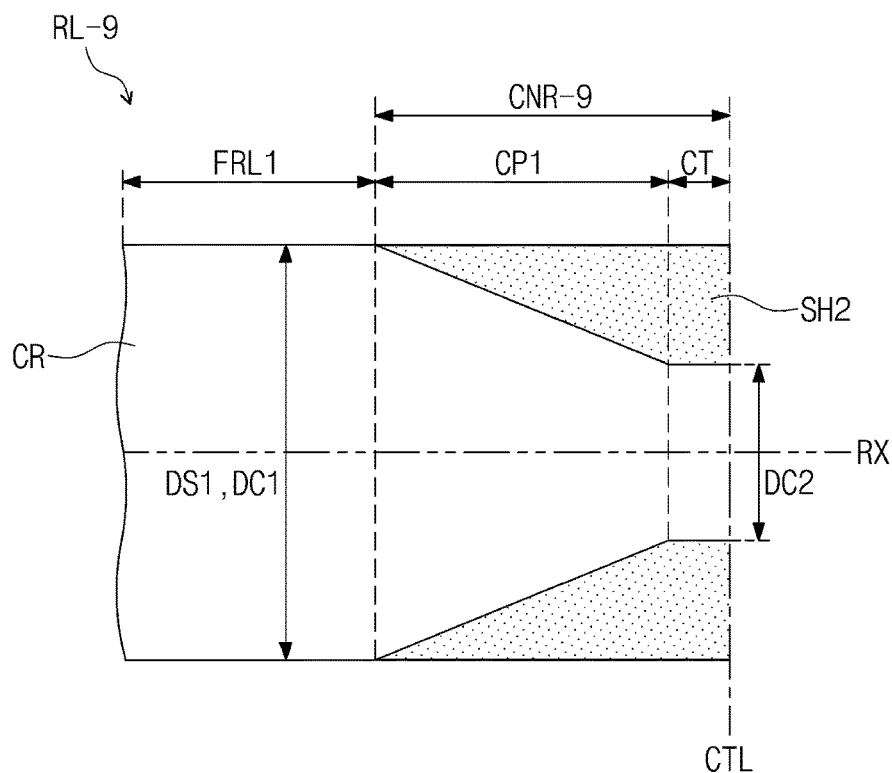

As illustrated in FIG. 17C, the roller RL-9 according to another embodiment of the inventive concept does not include the first cover part SH1. Also, the connection part CNR-9 may further include a second cover part SH2.

According to an embodiment, the second cover part SH2 on the first connection part CP1 may have a thickness that gradually increases in a direction that is adjacent to the central part CT. An increase rate in thickness of the second cover part SH2 provided on a first connection part CP1 may be the same as a decrease rate in thickness of a core part CR provided in the first connection part CP1.

Figure 17D:
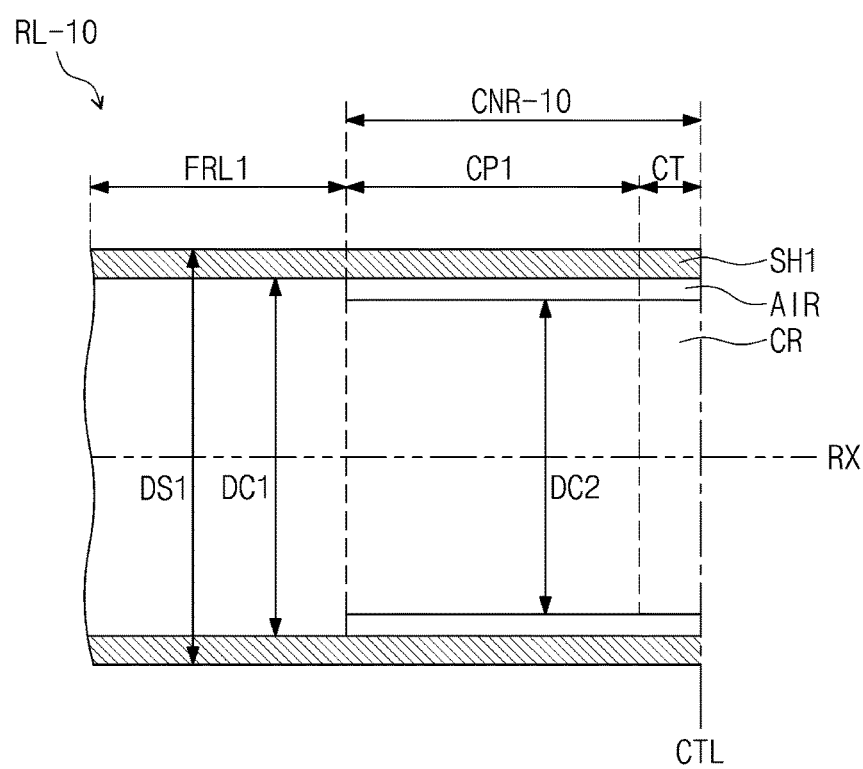

As illustrated in FIG. 17D, core parts of a first pressing part FRL1 and a connection part CNR-10 of a roller RL-10 according to another embodiment of the inventive concept have diameters different from each other. The core part CR of the first pressing part FRL1 has a first core diameter DC1. The core part CR of the connection part CNR-10 has a second core diameter DC2. The second core diameter DC2 has a value less than that of the first core diameter DC1. In an embodiment, each of the first core diameter DC1 and the second core diameter DC2 has a predetermined value.

In an embodiment, the first cover part SH1 has a uniform thickness.

The connection part CNR-10 according to an embodiment may further include an air layer AIR. The air layer AIR is disposed between the core part CR and the first cover part SH1.

Figure 17E:
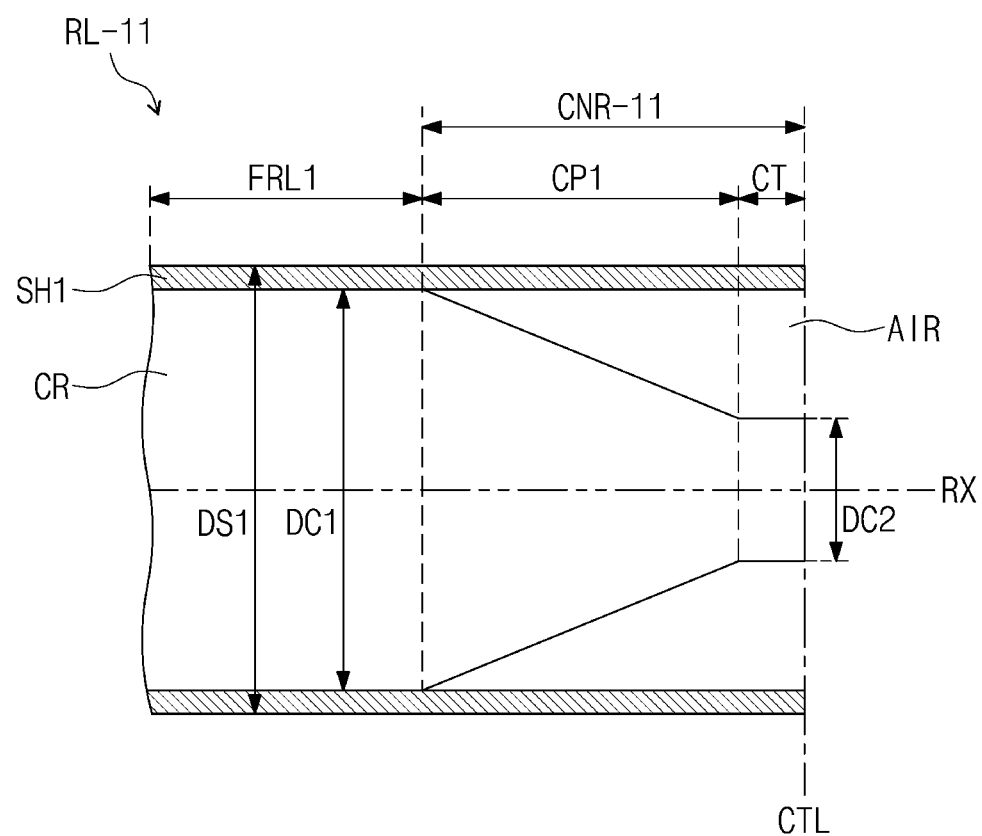

As illustrated in FIG. 17E, the core part CR provided in the first connection part CP1 of the roller RL-11 according to another embodiment of the inventive concept has a funnel shape in a cross-section. That is, the core part CR provided in the first connection part CP1 includes an inclined surface in the cross-section. The core part CR of the first connection part CP1 has a diameter that gradually decreases in the direction that is adjacent to the central part CT. In an embodiment, the core part CR of the central part CT has a predetermined diameter.

In an embodiment, each of the first connection part CP1 of the connection part CNR-11 and the central part CT further includes an air layer AIR. The air layer AIR is disposed between the core part CR and the first cover part SH1. In an embodiment, the air layer AIR of the first connection part CP1 has a thickness that gradually increases in the direction that is adjacent to the central part CT, and the air layer AIR of the central part CT has a predetermined thickness.

According to embodiments of the inventive concept, the display quality of a display apparatus may be improved.

It will be apparent to those skilled in the art that various modifications and variations can be made in the inventive concept. Thus, it is to be understood that the present disclosure covers such modifications and variations of this invention within the scope of the appended claims and their equivalents. Thus, the scope of the present invention is to be determined by the broadest permissible interpretation of the claims and their equivalents, and shall not be restricted or limited by the foregoing detailed description.

What is claimed is:

1. A method for laminating a display apparatus, the method comprising:
    seating a plurality of plates on a seating area defined on a stage;
    seating a first adhesion member on the plates;
    seating a display module foldable about a folding axis on the first adhesion member; and
    pressing the display module to laminate the plates with the display module,
    wherein the seating area comprises:
    first and second areas defined on the stage to be spaced apart from each other and overlap with non-folding areas of the display module; and
    a third area defined between the first and second areas on the stage to overlap with a folding area of the display module and comprising a spaced area,
    wherein, in the seating of the plurality of plates, the plates are spaced apart from each other over the spaced area, and the folding axis overlaps the spaced area on a plane, and
    in the laminating of the plates with the display module, a pressing force applied to the third area is less than that applied to each of the first and second areas.

2. The method of claim 1, wherein, in the laminating of the plates with the display module, the display module is pressed by using a laminating roller, which extends in a direction perpendicular to the folding axis on the plane and rotates to move in a direction parallel to the folding axis.

3. The method of claim 2, wherein the laminating roller comprises:
    first and second pressing parts overlapping the first and second areas to press the non-folding areas of the display module; and
    a connection part connecting the first and second pressing parts to each other and overlapping at least the third area to press the folding area of the display module,
    wherein the connection part has a diameter less than that of each of the pressing parts.

4. The method of claim 3, wherein the connection part comprises:
    a first connection part connected to the first pressing part;
    a second connection part connected to the second pressing part; and
    a central part connecting the first connection part to the second connection part and pressing the folding area of the display module overlapping the spaced area,
    wherein the central part has a diameter that is equal to or less than a mean diameter of each of the first connection part and the second connection part.

5. The method of claim 4, wherein at least a portion of the laminating roller has an outer circumferential surface that has a modulus less than that of the central part.

6. The method of claim 2, wherein the laminating roller comprises:
    first and second pressing parts overlapping the first and second areas to press the non-folding areas of the display module; and a connection part connecting the first and second pressing parts to each other and overlapping at least the third area to press the folding area of the display module,
wherein each of the first and second pressing parts has a modulus greater than that of the connection part.

7. The method of claim 1, wherein the display module comprises a display panel comprising a plurality of display elements to display an image.

\* \* \* \* \*